(12) United States Patent
Iwata

(10) Patent No.: US 8,339,856 B2
(45) Date of Patent: Dec. 25, 2012

(54) NON-VOLATILE SEMICONDUCTOR MEMORY DEVICE AND SEMICONDUCTOR DEVICE

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 242 days.

(21) Appl. No.: 12/886,874

(22) Filed: Sep. 21, 2010

(65) Prior Publication Data

US 2011/0157989 A1 Jun. 30, 2011

(30) Foreign Application Priority Data

Dec. 28, 2009 (JP) ................................. 2009-296814

(51) Int. Cl.
*G11C 16/04* (2006.01)
(52) U.S. Cl. .............................. 365/185.17; 365/185.18
(58) Field of Classification Search .................... None
See application file for complete search history.

(56) References Cited

U.S. PATENT DOCUMENTS

2007/0252201 A1 11/2007 Kito et al.
2009/0296476 A1* 12/2009 Shin et al. ................. 365/185.17
2010/0172189 A1 7/2010 Itagaki et al.
2010/0214838 A1 8/2010 Hishida et al.

OTHER PUBLICATIONS

U.S. Appl. No. 12/718,353, filed Mar. 5, 2010, Tomoo Hishida, et al.
H. Tanaka, et al., "Bit Cost Scalable Technology with Punch and Plug Process for Ultra High Density Flash Memory," Symposium on VLSI Technology, 2007, 2 pages.
Takashi Maeda, et al., "Multi-stacked 1G cell/layer Pipe-shaped BiCS Flash Memory," Symposium on VLSI Circuits, 2009, 2 pages.

* cited by examiner

Primary Examiner — Hoai V Ho
Assistant Examiner — James G Norman
(74) Attorney, Agent, or Firm — Oblon, Spivak, McClelland, Maier & Neustadt, L.L.P.

(57) ABSTRACT

A control circuit is configured to erase a selected block in the erase operation by applying a predetermined potential to the source-line and the third conductive layer to generate a current to increase a potential of the first columnar semiconductor layer and by providing a first voltage to the first conductive layer. The control circuit is configured to keep first conductive layers at a floating state during the first period, while during the second period after the first period, to switch the first conductive layers from the floating state to a state in which the conductive layer is charged to a second voltage higher than the first voltage, in an unselected block in the erase operation.

20 Claims, 26 Drawing Sheets

NON-VOLATILE SEMICONDUCTOR MEMORY DEVICE AND SEMICONDUCTOR DEVICE

CROSS-REFERENCE TO RELATED APPLICATIONS

This application is based upon and claims the benefit of priority from the prior Japanese Patent Application No. 2009-296814, filed on Dec. 28, 2009, the entire contents of which are incorporated herein by reference.

BACKGROUND

1. Field

The embodiments described herein relate to a non-volatile semiconductor memory device that is able to electrically rewrite data, and a semiconductor device.

2. Description of the Related Art

Conventional LSIs are formed by integration of devices in a two-dimensional plane on the silicon substrate. Although the storage capacity of a memory has been generally increased by reducing (miniaturizing) the dimension of each device, in recent years, the miniaturization has become difficult in terms of cost and technology. Although the miniaturization requires the improved photolithography technology, the cost of the lithography process has been increasingly increased. Even if the miniaturization is achieved, it is expected that a physical limitation such as the breakdown voltage between devices will be reached, unless the drive voltage or the like is scaled. In other words, it will probably be difficult for a memory to operate as a device.

In recent years, therefore, for a more integrated memory, a number of semiconductor memory devices including three-dimensionally arranged memory cells have been proposed.

One conventional semiconductor memory device including three-dimensionally arranged memory cells is a semiconductor memory device including a cylindrical structure transistor. The semiconductor memory device including a cylindrical structure transistor includes multilayered polysilicon as the gate electrode and a columnar semiconductor. The columnar semiconductor functions as the channel (body) of the transistor. Around the columnar semiconductor, a plurality of charge accumulation layers are provided via tunnel insulating layers, the charge accumulation layers being for accumulating charges. Further, the charge accumulation layers have a block insulating layer formed therearound. The configuration including these polysilicon, columnar semiconductor, tunnel insulating layer, charge accumulation layer, and block insulating layer is called a memory string.

In the erase operation of a conventional semiconductor memory device including the three-dimensionally arranged memory cells, in the selected block, the voltage of the columnar semiconductor as the memory cell body is boosted using the GIDL current (Gate Induced Drain Leakage Current), and the voltage of the word-line is kept at, for example, 0V, thereby performing the data erase. At the same time, in the unselected block, the voltage of the word-line is kept in the floating state, and if the potential of the columnar semiconductor is increased by the GIDL current, the potential of the floating word-line is increased to a predetermined potential due to capacitive coupling. This prevents data erase in the unselected block. This scheme requires, without supplying a special voltage to the word-line in the unselected block, only cutting off the driving transistor in the row decoder, thereby providing the efficient erase operation.

This scheme has a problem, however, that even if the voltage of the word-line in the unselected block is increased due to capacitive coupling, a subsequent leak current of the driving transistor can cause the voltage of the word-line in the unselected block to be gradually decreased. The voltage of the word-line in the unselected block being decreased below a predetermined voltage due to the leak current can cause a data erasing error in the unselected block. Accordingly, there is a need for a laminated non-volatile semiconductor memory device that may efficiently perform the erase operation and prevent the erasing error.

DETAILED DESCRIPTION

Figure 1:
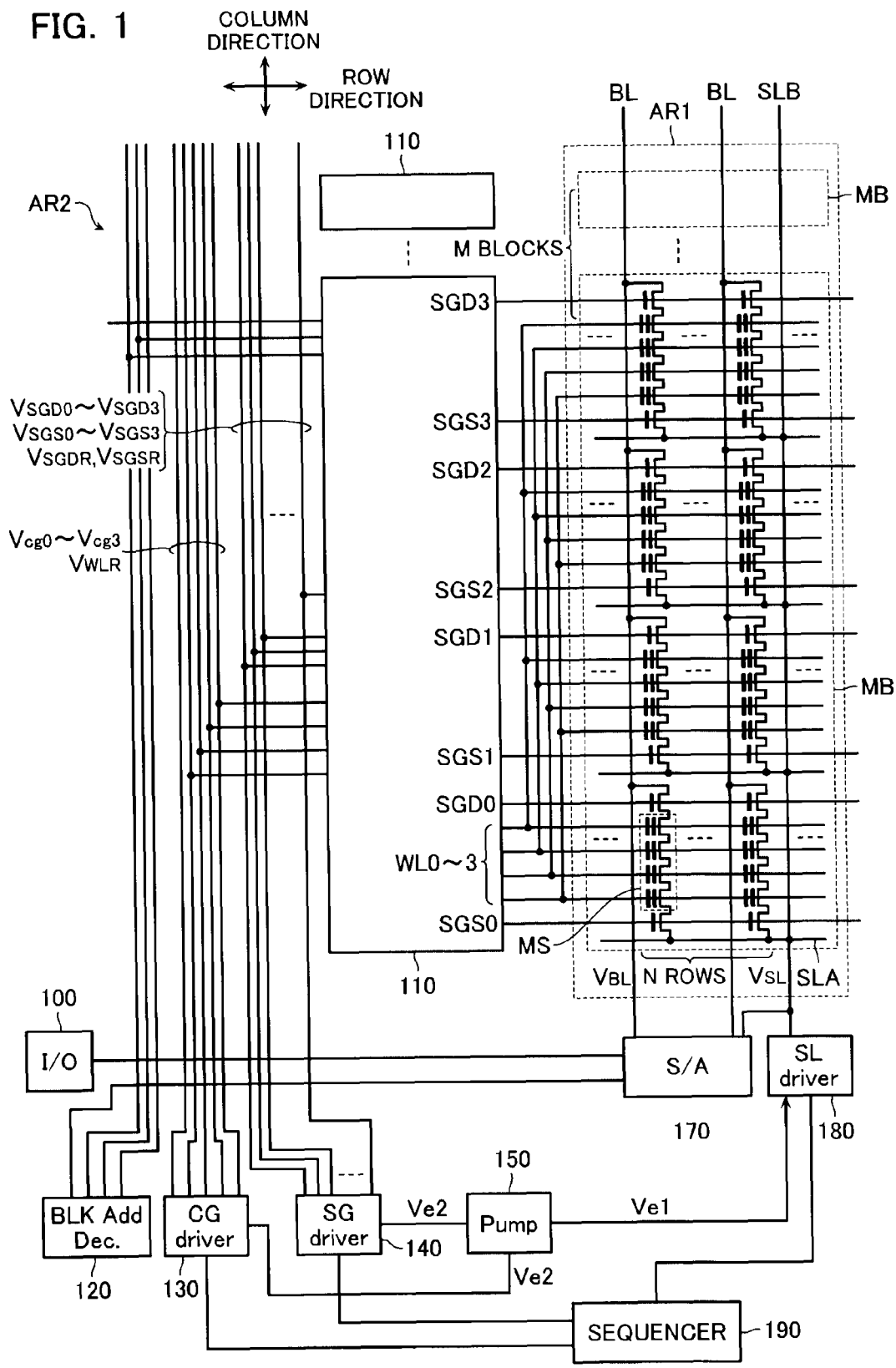
FIG. 1 is a configuration diagram of a non-volatile semiconductor memory device according to a first embodiment.

A non-volatile semiconductor memory device according to an aspect includes a memory cell array and a control circuit. The memory cell array includes an array of NAND cell units. The NAND cell unit includes a memory string, and a drain-side select transistor and a source-side select transistor connected to the ends of the memory string, respectively. The memory string includes a plurality of electrically rewritable memory cells connected in series. The control circuit is configured to apply various voltages on a memory cell array for reading, writing, and erasing data. The NAND cell unit includes a first columnar semiconductor layer, a plurality of first conductive layers, a second columnar semiconductor layer, a second conductive layer, a third columnar semiconductor layer, and a third conductive layer. The first columnar semiconductor layer is formed extending in the direction perpendicular to a substrate, the first semiconductor layer functioning as bodies of the memory cells. The first conductive layers are formed around the first columnar semiconductor layer with a charge accumulation layer for accumulating charges and a gate-insulating film sandwiched therebetween, and the first conductive layers being formed over a plurality of layers, and each of the first conductive layers functioning as a word-line for selecting the memory cell. The second columnar semiconductor layer is formed in contact with a first end portion of the first columnar semiconductor layer and is formed extending in a direction perpendicular to the substrate, the second columnar semiconductor layer functioning as a body of the drain-side select transistor. The second conductive layer is formed around the second columnar semiconductor layer with a gate-insulating film sandwiched therebetween, the second conductive layer functioning as a select-gate-line of the drain-side select transistor. The third columnar semiconductor layer is formed in contact with a second end portion of the first columnar semiconductor layer and is formed extending in a direction perpendicular to the substrate, the third columnar semiconductor layer functioning as a body of the source-side select transistor. The third conductive layer is formed around the third columnar semiconductor layer with a gate-insulating film sandwiched therebetween, the third conductive layer functioning as a select-gate-line of the source-side select transistor. A bit-line is connected to one end of the second columnar semiconductor layer. A source-line is connected to one end of the third columnar semiconductor layer. The NAND cell units share the same first conductive layer and form a block as a unit of an erase operation of the memory cell. The control circuit is configured to erase a selected block in the erase operation by applying a predetermined potential to the source-line and the third conductive layer to generate a current to increase a potential of the first columnar semiconductor layer and by providing a first voltage to the first conductive layer. The control circuit is configured to keep the first conductive layers at a floating state for a first period, and during a second period after the first period, to switch the first conductive layers from the floating state to a state in which the first conductive layer is charged to a second voltage higher than the first voltage, in an unselected block in the erase operation.

A semiconductor device according to an aspect includes a control circuit applying to a memory cell array various voltages for reading, writing, and erasing data. The memory cell array includes an array of NAND cell units. Each NAND cell unit includes a memory string including a plurality of electrically rewritable memory cells connected in series, and a drain-side select transistor and a source-side select transistor connected to the ends of the memory string, respectively. The NAND cell unit includes a first columnar semiconductor layer, a plurality of first conductive layers, a second columnar semiconductor layer, a second conductive layer, a third columnar semiconductor layer, and a third conductive layer. The first columnar semiconductor layer is formed extending in a direction perpendicular to a substrate and functions as bodies of the memory cells. The first conductive layer is formed around the first columnar semiconductor layer with a charge accumulation layer for accumulating charges and a gate-insulating film sandwiched therebetween, and the first conductive layers being formed over a plurality of layers and each of the first conductive layers functioning as a word-line for selecting the memory cell. The second columnar semiconductor layer is formed in contact with a first end portion of the first columnar semiconductor layer and is formed extending in a direction perpendicular to the substrate, and functions as a body of the drain-side select transistor. The second conductive layer is formed around the second columnar semiconductor layer with a gate-insulating film sandwiched therebetween, and functions as a select-gate-line of the drain-side select transistor. The third columnar semiconductor layer is formed in contact with a second end portion of the first columnar semiconductor layer, and is formed extending in a direction perpendicular to the substrate, and functions as a body of the source-side select transistor. The third conductive layer is formed around the relevant the third columnar semiconductor layer with a gate-insulating film sandwiched therebetween, and functions as a select-gate-line of the source-side select transistor. A bit-line is connected to one end of the second columnar semiconductor layer. A source-line is connected to one end of the third columnar semiconductor layer. The NAND cell units share the same first conductive layer and form a block as a unit of an erase operation of the memory cell. A control circuit is configured to erase a selected block in the erase operation by applying a predetermined potential to the source-line and the third conductive layer to generate a current to increase a potential of the first columnar semiconductor layer and by providing a first voltage to the first conductive layer. The control circuit is configured to keep a first conductive layers at a floating state during the first period, while during the second period after the first period, to switch the first conductive layers from the floating state to a state in which the conductive layer is charged to a second voltage higher than the first voltage, in an unselected block in the erase operation.

Referring now to the drawings, one embodiment of a non-volatile semiconductor memory device will be described below.

[First Embodiment]
(A Configuration of a Non-Volatile Semiconductor Memory Device According to a First Embodiment)

Figure 2:
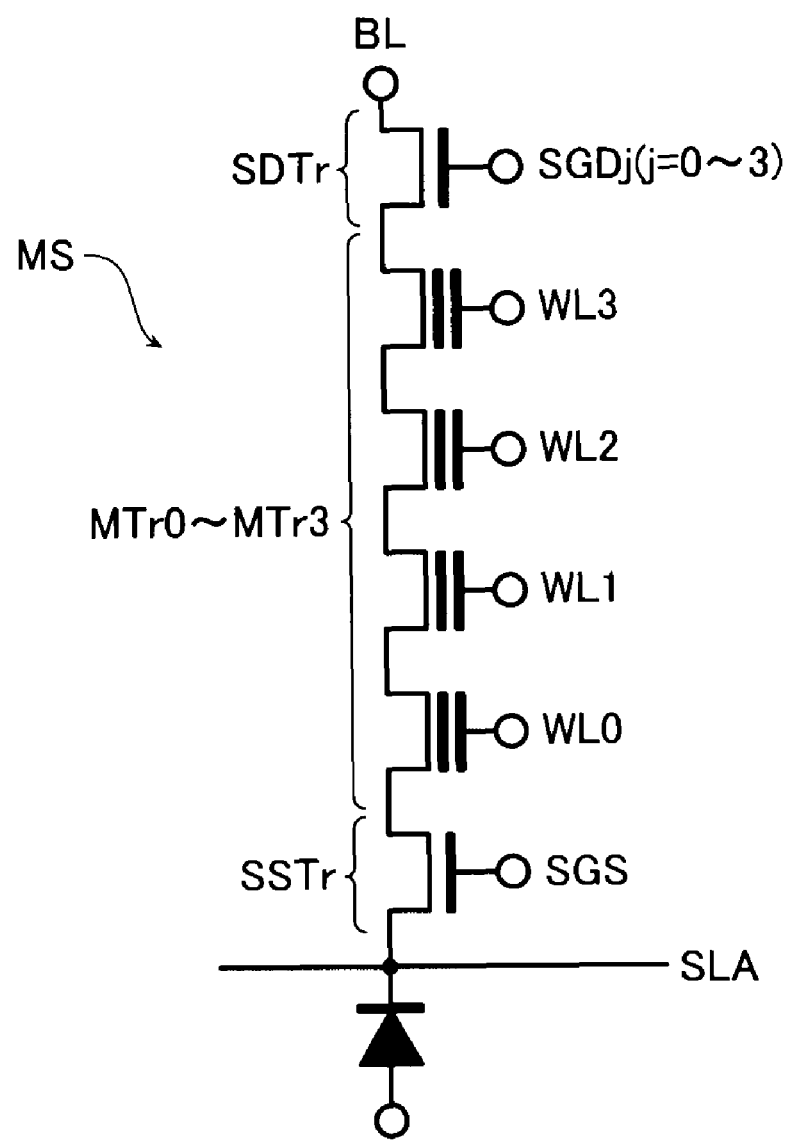
FIG. 2 is a circuit diagram of one memory string MS in the first embodiment.
Figure 3:
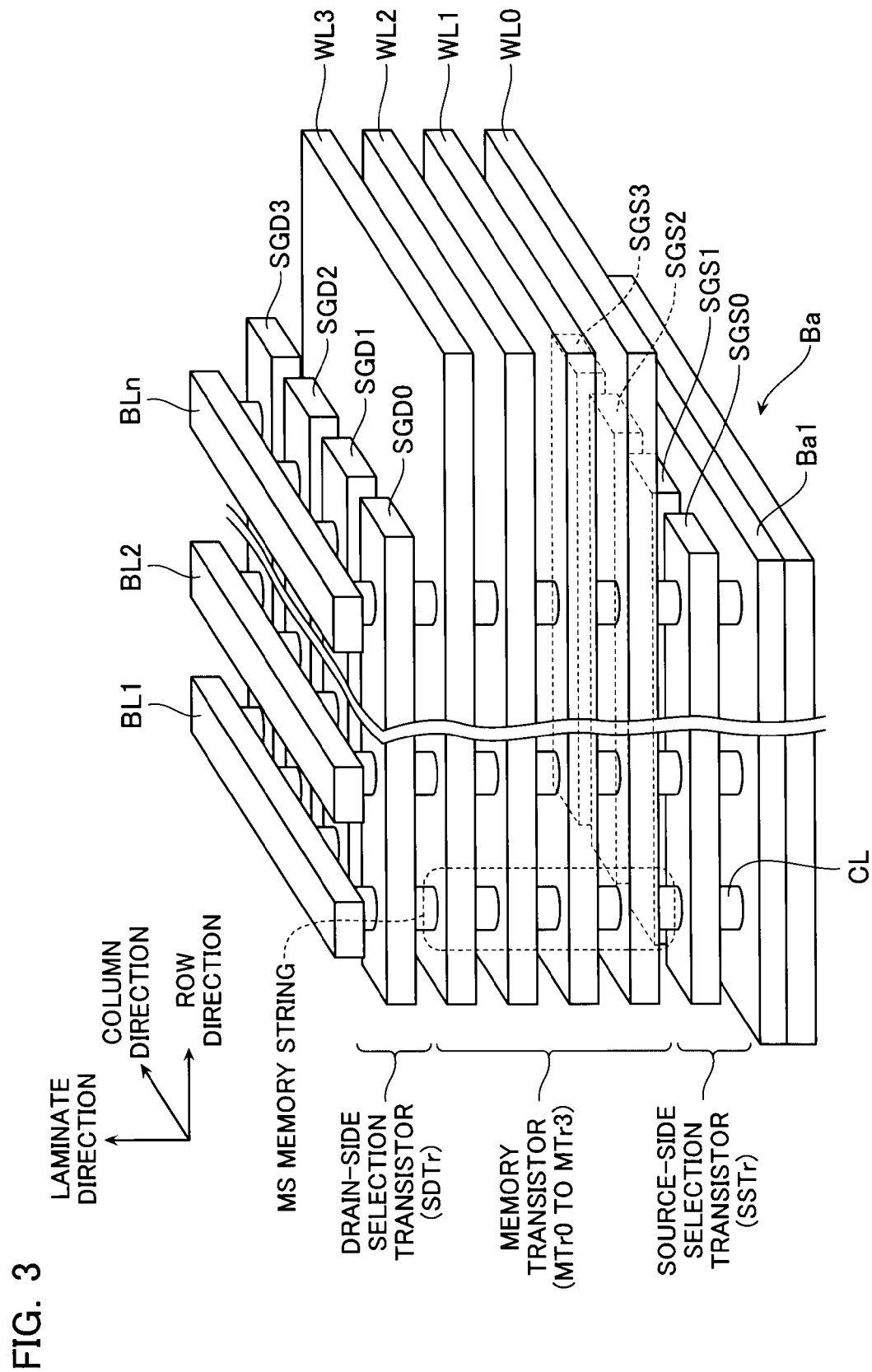
FIG. 3 is a partial schematic perspective view of a memory transistor region in a non-volatile semiconductor memory device according to the first embodiment.
Figure 4:
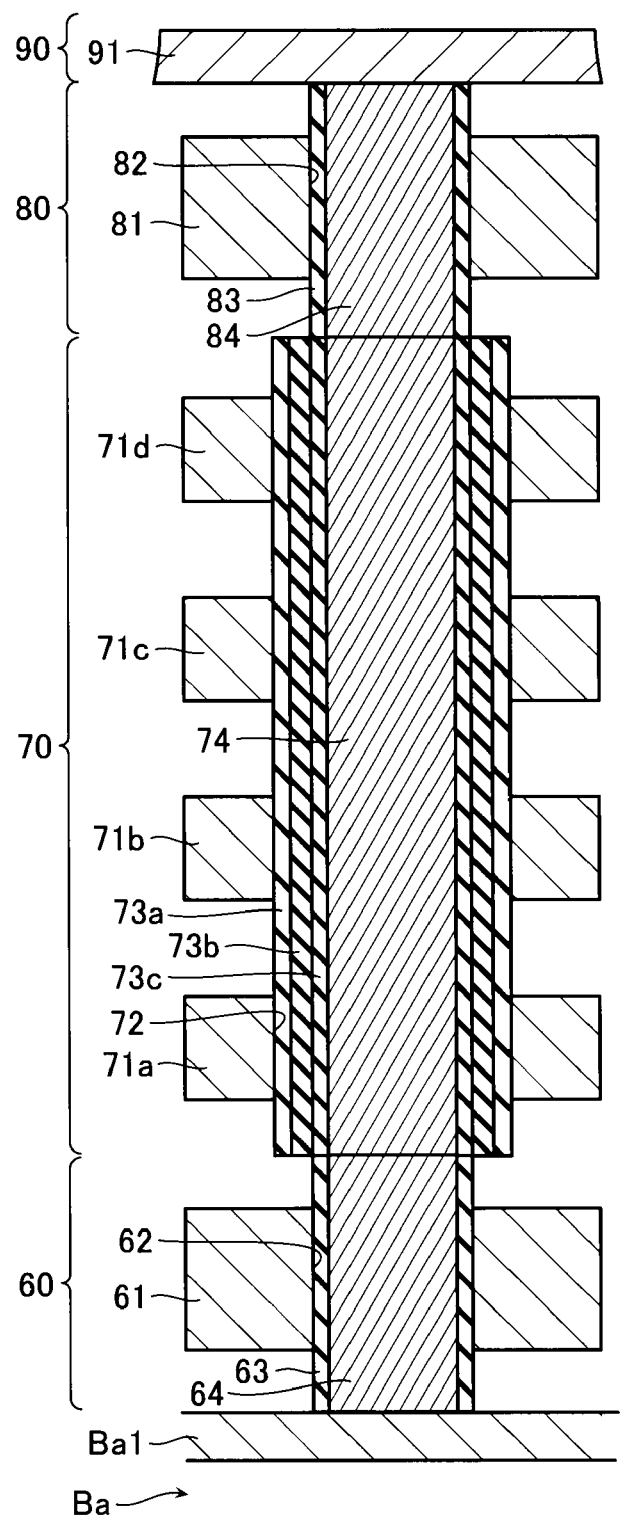
FIG. 4 is a cross-section structure diagram of a memory string MS in the first embodiment.

Referring now to FIG. 1 to FIG. 4, a schematic configuration of a non-volatile semiconductor memory device according to a first embodiment is described. FIG. 1 is a circuit diagram of a non-volatile semiconductor memory device according to the first embodiment. FIG. 2 is an equivalent circuit diagram of one NAND cell unit. FIG. 3 is a schematic perspective view of the structure of the memory cell array AR1. FIG. 4 shows a cross-section structure of one NAND cell unit.

With reference to FIG. 1, a non-volatile semiconductor memory device according to the first embodiment includes a memory cell array AR1 and a control circuit AR2.

The memory cell array AR1 includes, as shown in FIG. 1, m memory blocks MB arranged in the column direction. Each memory block MB includes an n-row and 4 column memory string MS, a source-side select transistor SSTr connected to a first end of the memory string MS, and a drain-side select transistor SDTr connected to a second end of the memory string MS. The memory string MS and the select transistors SSTr and SDTr connected to its ends together form one NAND cell unit. The one memory block MB includes 4×n NAND cell units disposed in a matrix. Each NAND cell unit is formed as a laminated NAND cell unit extending in a direction perpendicular to the semiconductor substrate, as will be described in more detail below. Specifically, the memory cell array AR1 has a three-dimensional structure in which the memory cells are arranged in a direction parallel to, as well as in a direction perpendicular to, the substrate.

The one memory string MS includes, as shown in FIG. 2, memory transistors MTr0 to MTr3 that together form the memory cell. The memory transistors MTr0 to MTr3 are connected to provide a series current path. Each of the memory transistors MTr0 to MTr3 is configured in a MONOS structure. The memory transistor stores data by storing charges in a charge accumulation film (for example, a silicon nitrogen film).

The control gates of the memory transistors MTr0 to MTr3 are connected to, as shown in FIG. 2, the respective word-lines WL0 to WL3. With reference to FIG. 1, each word-line WLi (i=0 to 3) is connected in common to the control gates of the memory transistors MTri in 4×n memory strings MS arranged in a matrix in one memory block MB.

The drain of the source-side select transistor SSTr is connected to, as shown in FIG. 2, the source of the memory transistor MTr1. The source of the source-side select transistor SSTr is connected to the source-line SLA. The control gate of the source-side select transistor SSTr is connected to the source-side select-gate-line SGS.

Referring to FIG. 1, the source-line SLA is connected in common to the sources of the source-side select transistors SSTr arranged in a matrix (4×n) in one memory block MB, and is connected in common to the memory blocks MB. The source-side select-gate-lines SGS are formed in a stripe pattern to extend in the row direction in a memory block MB. The source-side select-gate-lines SGS are thus provided in common to the control gates of the source-side select transistors SSTr arranged in the row direction.

Referring to FIG. 2, the drain-side select transistor SDTr has a first end connected to one end of the memory transistor MTr3. The drain-side select transistor SDTr has a second end connected to a bit-line BL. The control gate of the drain-side select transistor SDTr is connected to a drain-side select-gate-line SGD.

Referring to FIG. 1, the bit-line BL is provided in common to one end of each drain-side select transistors SDTr aligned in the column direction and is formed to extend in the column direction across the memory blocks MB. The drain-side select-gate-line SGD is provided in common at the control gates of the drain-side select transistors SDTr aligned in the row direction, and is formed to extend in the row direction over the memory strings MS.

Referring to FIG. 1, the control circuit AR2 includes an input/output circuit (I/O) 100, a row decoder circuit 110, a block address decoder circuit 120, a word-line driver circuit 130, a select-gate-line driver circuit 140, a booster circuit 150, a sense amplifier circuit 170, a source-line driver circuit 180, and a sequencer 190.

The row decoder circuit 110 is a circuit that according to a block address signal from the block address decoder circuits 120 and other address signals, selectively supplies voltages necessary for various operations to the word-line WL and the select-gate-lines SGD and SGS. Note that in this embodiment, if the corresponding memory block MB is unselected, the row decoder circuit 110 keeps the word-lines WL0 to WL3 of the memory block MB in a floating state for a predetermined period, and then switches from the floating state to a state in which the word-lines are charged to a predetermined voltage $V_{WLR}$, as will be described in more detail below.

Referring to FIG. 1, the word-line driver circuit 130 outputs voltages $V_{CG0}$ to $V_{CG3}$ supplied to the word-lines WL0 to WL3, and the voltage $V_{WLR}$.

The select-gate-line driver circuit 140 outputs voltages $V_{SGS0}$ to $V_{SGS3}$ supplied to the source-side select-gate-lines SGS, voltages $V_{SGD0}$ to $V_{SGD3}$ supplied to the drain-side select-gate-lines SGD, and also outputs voltages $V_{SGDR}$ and $V_{SGSR}$ to be supplied to the drain-side select-gate-lines SGD and the source-side select-gate-lines SGS of the unselected block. The booster circuit 150 supplies to the word-line driver circuit 130, the select-gate-line driver circuits 140, and the source-line driver circuit 180 with boosted voltages Ve1 and Ve2 boosted from the power supply voltage. Note that the boosted voltage Ve1 rises a predetermined period earlier before the Ve2.

In the data reading, the sense amplifier circuit 170 differentially amplifies the voltage on the bit-line BL using the reference voltage to determine data held by the memory transistor. While in the data writing, the sense amplifier circuit 170 supplies the bit-line BL with a voltage depending on the written data.

In the data reading and writing, the source-line driver circuit 180 keeps the source-line SLA at the ground voltage (0V). While in the data erasing, the source-line driver circuit 180 supplies the source-line SLA with the voltage Ve1. The voltage Ve1 is to generate a GIDL current in combination with the voltage Ve2 applied to the select-gate-line SGS. The GIDL current increases the potential of a columnar semiconductor CL for the erase operation.

The sequencer 190 outputs to the various driver circuits 130, 140, and 180 control signals PROGRAM, READ, and ERASE to instruct the circuits to perform various operations.

Referring now to FIG. 3 and FIG. 4, a laminate structure of a non-volatile semiconductor memory device according to the first embodiment will be described. FIG. 3 is a schematic perspective view of one memory block MB in the memory cell array AR1 of a non-volatile semiconductor memory device according to the first embodiment. FIG. 4 is a partial cross-sectional view of FIG. 3.

With reference to FIG. 3, one memory block MB includes an array of 4×n memory strings MS. Each memory string MS includes the memory transistors MTr0 to MTr3, the source-side select transistor SSTr, and the drain-side select transistor SDTr, which are connected in series in the laminate direction.

Each memory string MS includes the columnar semiconductor CL on the n+ region formed in the P-well region Ba1 of the semiconductor substrate Ba. Each columnar semiconductor CL is formed extending in a direction perpendicular to the semiconductor substrate Ba, and is disposed in a matrix on the semiconductor substrate Ba. The columnar semiconductor CL functions as a body (channel region) of the memory transistors MTr0 to MTr3, the drain-side select transistor SDTr, and the source-side select transistor SSTr. Note that the columnar semiconductor CL may be cylindrical or prismatic in shape. The columnar semiconductor CL includes a columnar semiconductor having a stepped shape.

The word-lines (WL0 to WL3) connected to the gates of the respective memory transistors (MTr0 to MTr3) in each memory string MS are also connected in common to the memory transistors in other memory strings MS in the same memory block MB. Specifically, all gates of the 4×n memory transistors MTr1 in one memory block MB are connected to the same word-line WL1. Likewise, all gates of the 4×n memory transistors MTr2 are connected to the same word-line WL2. All gates of the 4×n memory transistors MTr3 are connected to the same word-line WL3. All gates of the 4×n memory transistors MTr4 are connected to the same word-line WL4. Specifically, the word-lines WL0 to WL3 in one memory block MB each have a plane structure of a two-dimensionally extended plate. The word-lines WL0 to WL3 are each disposed in a direction generally perpendicular to the memory string MS.

The word-lines WL0 to WL3 are each formed in contact with the columnar semiconductors CL via a tunnel insulating film (silicon oxide film), a charge accumulation layer (silicon nitride film), and a block insulating film (silicon oxide film).

Referring to FIG. 3, around the lower portion of the columnar semiconductor CL of the memory string MS, the source-side select-gate-lines SGS0 to SGS3 are formed via the gate-insulating film (not in FIG. 3). The source-side select-gate-lines SGS0 to SGS3 and the columnar semiconductor CL together form the source-side select transistor SSTr.

The source-side select-gate-lines SGS are insulated and isolated from each other in the column direction. Specifically, the source-side select-gate-lines SGS, unlike the word-lines WL1 to WL4, each have a longitudinal direction in the row direction parallel to the semiconductor substrate Ba (a direction perpendicular to the laminate direction), and are each provided in a line pattern and repeated in the column direction with a predetermined pitch interval. Around the center of the width direction of each source-side select-gate-line SGS, the columnar semiconductor layer CL is formed passing through the center.

Referring to FIG. 3, around the upper portions of the memory strings MS, the drain-side select-gate-lines SGD0 to SGD3 are provided. Each drain-side select-gate-line is in contact with the columnar semiconductor CLmn via the gate-insulating film (not in FIG. 3) to form a portion of the drain-side select transistor SDTrmn. The drain-side select-gate-lines SGD are insulated and isolated from each other and, unlike the word-lines WL1 to WL4. Each of the drain-side select-gate-lines SGD have a longitudinal direction in the row direction, and each provided in a line pattern and repeated in the column direction with a predetermined pitch interval. Around the center of the width direction of each drain-side select-gate-line SGD, the columnar semiconductor layer CL is formed passing through the center.

The bit-line BL are each connected to the first end of the memory string MS via the drain-side select transistor SDTr. The bit-lines BL each have a longitudinal direction in the column direction and are formed in a stripe pattern.

Referring now to FIG. 4, a cross-sectional view of one memory string MS is shown. The memory string MS is provided, as shown in FIG. 4, on the substrate Ba. The memory string MS includes a source-side select transistor layer 60, a memory transistor layer 70, a drain-side select transistor layer 80, and an interconnection layer 90. The substrate Ba has a diffusion layer Ba1 formed thereon. The diffusion layer Ba1 functions as the source-line SLA.

The source-side select transistor layer 60 functions as the source-side select transistor SSTr. The memory transistor layer 70 functions as the memory transistors MTr0 to MTr3 (the memory string MS). The drain-side select transistor layer 80 functions as the drain-side select transistor SDTr. The interconnection layer 90 functions as the bit-line BL.

The source-side select transistor layer 60 includes, as shown in FIG. 4, a source-side conductive layer 61. The source-side conductive layers 61 are formed in a stripe pattern extending in the row direction parallel to the substrate Ba.

The source-side conductive layer 61 is formed of polysilicon (p-Si). The source-side conductive layer 61 functions as the source-side select-gate-line SGS. The source-side conductive layer 61 also functions as the gate of the source-side select transistor SSTr.

The source-side select transistor layer 60 also includes, as shown in FIG. 4, a source-side gate-insulating layer 63, and a source-side columnar semiconductor layer 64. The source-side gate-insulating layer 63 is formed in contact with the side of the source-side columnar semiconductor layer 64. The source-side columnar semiconductor layer 64 forms a portion of the columnar semiconductor layer CL. The layer 64 is formed in a columnar shape in contact with the diffusion layer Ba1 and extending in a direction perpendicular to the substrate Ba. The source-side gate-insulating layer 63 is formed of, for example, silicon dioxide ($SiO_2$). The source-side columnar semiconductor layer 64 is formed of polysilicon (p-Si).

The memory transistor layer 70 includes, as shown in FIG. 4, a laminate of word-line conductive layers 71a to 71d. The word-line conductive layers 71a to 71d are each formed as a plate extending in the row and column directions parallel to the substrate Ba. The word-line conductive layers 71a to 71d form the respective word-lines WL0 to WL3 in FIG. 3. The word-line conductive layers 71a to 71d are formed of, for example, polysilicon (p-Si).

The memory transistor layer 70 also includes a block insulating layer 73a, a charge accumulation layer 73b, a tunnel insulating layer 73c, and a memory columnar semiconductor layer 74. The memory columnar semiconductor layer 74 forms a portion of the columnar semiconductor layer CL. The memory columnar semiconductor layer 74 functions as a body of the memory string MS.

The block insulating layer 73a is formed on the sidewall of the word-line conductive layers 71a to 71d with a predetermined thickness. The charge accumulation layer 73b is formed on the sidewall of the block insulating layer 73a with a predetermined thickness. The tunnel insulating layer 73c is formed on the sidewall of the charge accumulation layer 73b with a predetermined thickness. The memory columnar semiconductor layer 74 is in contact with the sidewall of the tunnel insulating layer 73c. The memory columnar semiconductor layer 74 is in contact with the top surface of the source-side columnar semiconductor layer 64, and the bottom surface of the drain-side columnar semiconductor layer 84 as described below. The memory columnar semiconductor layer 74 is also formed extending in a direction perpendicular to the substrate Ba.

The block insulating layer 73a and the tunnel insulating layer 73c are formed of silicon dioxide ($SiO_2$). The charge accumulation layer 73b is formed of silicon nitride (SiN). The memory columnar semiconductor layer 74 is formed of polysilicon (p-Si).

The drain-side select transistor layer 80 includes, as shown in FIG. 4, a drain-side conductive layer 81. The drain-side conductive layers 81 are formed in a stripe pattern that extends in the row direction and has a predetermined pitch in the column direction. The drain-side conductive layer 81 is formed of polysilicon (p-Si). The drain-side conductive layer 81 functions as the drain-side select-gate-line SGD.

The drain-side select transistor layer 80 includes, as shown in FIG. 4, a drain-side gate-insulating layer 83 and a drain-side columnar semiconductor layer 84. The drain-side gate-insulating layer 83 is formed on the sidewall of the drain-side columnar semiconductor layer 84 with a predetermined thickness. The drain-side columnar semiconductor layer 84 is formed in contact with the sidewall of the drain-side gate-insulating layer 83. The drain-side columnar semiconductor layer 84 is formed in contact with the top surface of the memory columnar semiconductor layer 74. The layer 84 is also formed extending in a direction perpendicular to the substrate Ba.

The drain-side gate-insulating layer 83 is formed of silicon dioxide ($SiO_2$). The drain-side columnar semiconductor layer 84 is formed of polysilicon (p-Si).

The interconnection layer 90 includes, as shown in FIG. 4, a bit-line layer 91. The bit-line layers 91 are formed in a stripe pattern that extends in the column direction and has a predetermined pitch in the row direction. The bit-line layer 91 is formed in contact with the top surface of the drain-side columnar semiconductor layer 84. The bit-line layer 91 is formed of polysilicon (p-Si). The bit-line layer 91 functions as the bit-line BL.

Figure 5A:
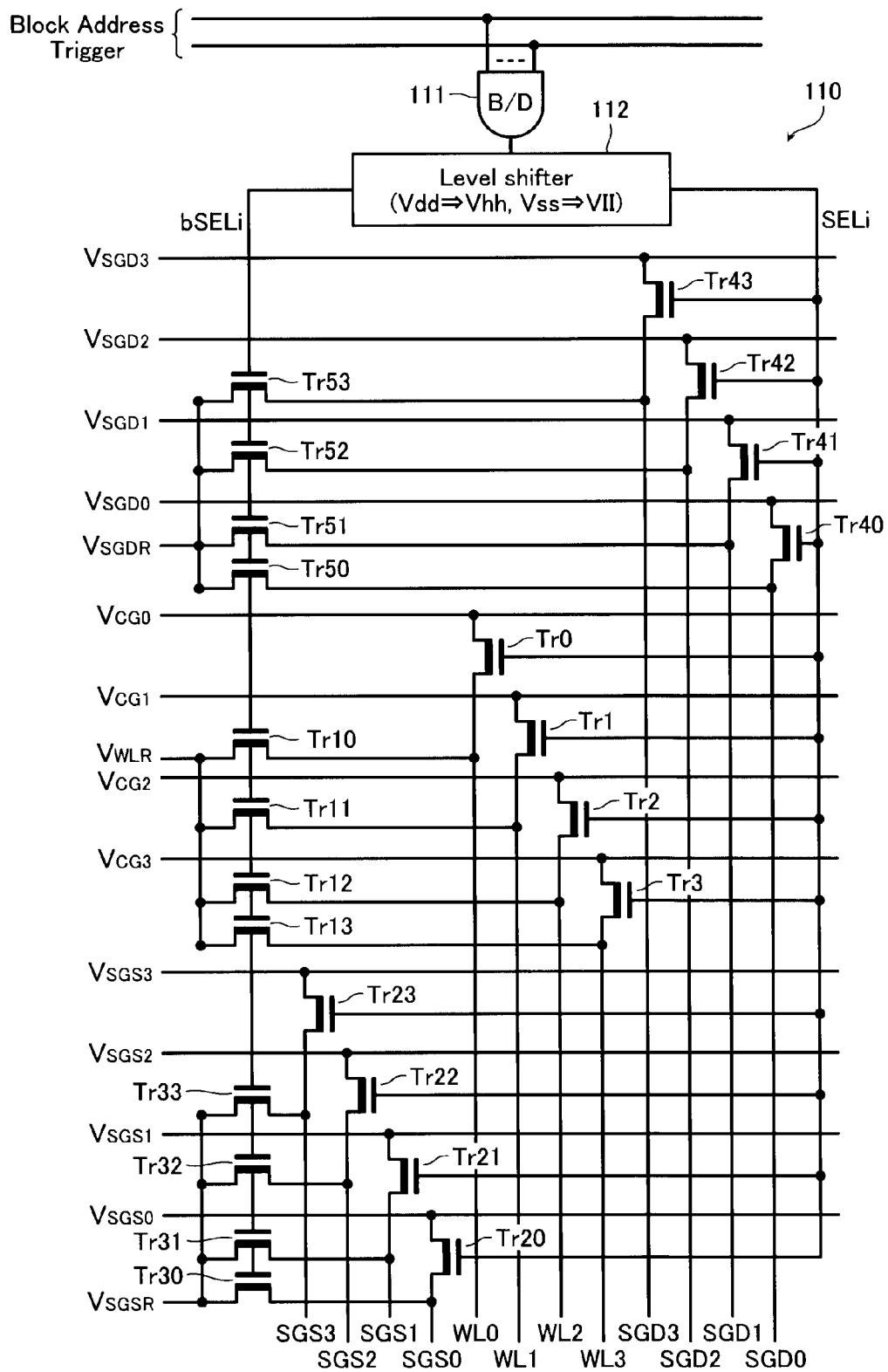
FIG. 5A is an equivalent circuit diagram showing a specific example configuration of the row decoder circuit 110 in FIG. 1.

FIG. 5A is a circuit diagram of a specific example configuration of the row decoder circuit 110 in FIG. 1. The row decoder circuit 110 includes a block decoder 111, a level shifter 112, first word-line driving transistors Tr0 to Tr3, second word-line driving transistors Tr10 to Tr13, first source-side select-gate-line driving transistors Tr20 to Tr23, second source-side select-gate-line driving transistors Tr30 to Tr33, first drain-side select-gate-line driving transistors Tr40 to Tr43, and second drain-side select-gate-line driving transistors Tr50 to Tr53. Note that in the following discussion, unless otherwise noted, it is assumed that the back gate of a transistor is connected to the ground terminal.

The block decoder 111 drives, according to a decode signal from the block address decoder 120, the level shifter 112. The level shifter 112 changes, according to the decode signal, the level of the output signal SELi between the high voltage Vhh higher than the power supply voltage Vdd and the negative voltage VII. The level shifter 112 also changes, according to the decode signal, the level of the output signal bSELi between the voltages Vhh and VII.

Figure 5B:
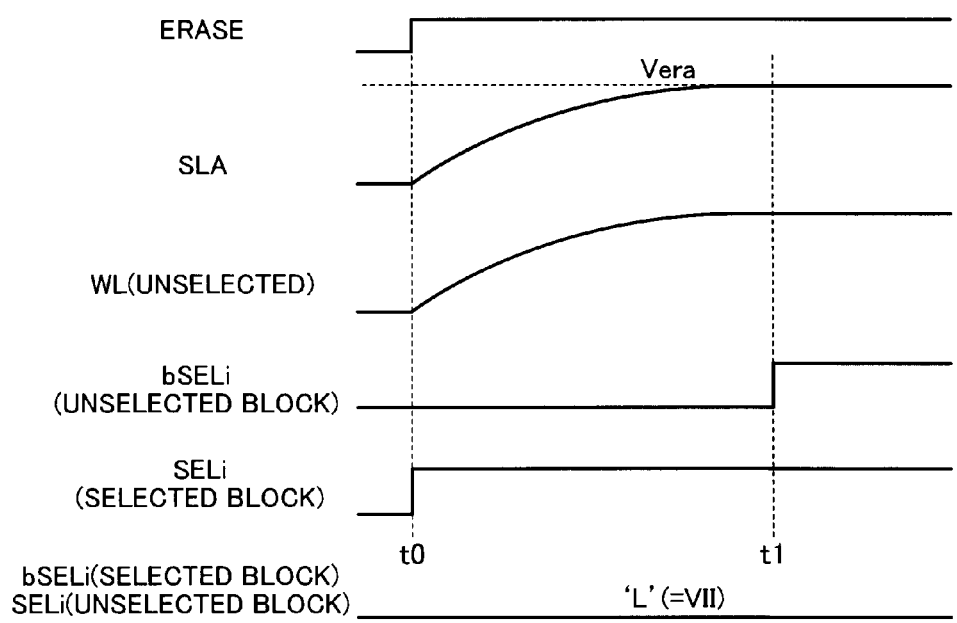
FIG. 5B is a timing diagram showing an operation of a non-volatile semiconductor memory device according to the first embodiment.

In the erase operation of the memory block MB, the level shifter 112 operates as follows. First, in the erase operation, at time t0, it is assumed that the erase command ERASE rises from "L" to "H" and the corresponding memory block MB is selected to be erased. In this case, the level shifter 111 changes, as shown in FIG. 5B, at time t0, the voltage level of the output signal SELi from the voltage VII to the voltage Vhh. While the corresponding memory block MB is selected, the output signal bSELi throughout keeps the voltage level at the voltage VII.

When, in the erase operation, the corresponding memory block MB is unselected (i.e., is not to be erased), the level shifter 111 throughout keeps, as shown in FIG. 5B, the voltage level of the output signal SELi at the voltage VII. The word-lines WL0 to WL3 and the select-gate-lines SGD0 to SGD3 and SGS0 to SGS3 are thus all kept in the floating state. Then, at time t1 later than time t0, the voltage level of the output signal bSELi is changed from the voltage VII to the voltage Vhh. The word-lines WL0 to WL3 and the select-gate-lines SGD0 to SGD3 and SGS0 to SGS3 are thus switched from the floating state to a state in which the lines are charged to the voltages $V_{WLR}$, $V_{SGDR}$, and $V_{SGSR}$, respectively.

In this way, according to this embodiment, the word-lines WL0 to WL3 of the memory block unselected in the erase operation are kept in the floating state from time t0 (when the erase operation starts) to time t1. When the voltage of the columnar semiconductor CL increases according to the GIDL current, the voltages of the word-lines WL0 to WL3 kept in the floating state increase due to capacitive coupling. If, however, the increase of the word-line WL voltage depends only on capacitive coupling, a leak current of the driving transistor may gradually decrease the word-line WL voltage and cause a memory cell erasing error in the unselected memory block MB.

Thus, in this embodiment, at time t1, the word-lines WL0 to WL3 of the unselected memory block MB are switched from the floating state to a state in which the word-lines are charged to the voltage $V_{WLR}$. The voltage $V_{WLR}$ is supplied to the word-lines WL0 to WL3 by changing the signal bSELi to "H" to render the transistors Tr10 to Tr13 conductive. This may prevent the voltage decrease of the word-line WL in the unselected memory block MB due to the leak current, thereby preventing the data erasing error in the unselected memory block MB.

It is also possible that the word-lines WL0 to WL3 in the unselected memory block MB may be charged to a predetermined voltage (for example about 15V) immediately after the erase operation starts. In this case, however, the voltage increase of the columnar semiconductor CL must occur almost concurrently with the potential increase of the word-lines WL0 to WL3. If not any difference will occur between the voltage of the columnar semiconductor CL and the voltage of the word-line WL, thereby causing a data erasing error of the memory cell in the unselected memory block MB. It becomes difficult to prevent such erasing error by controlling the word-line voltage. In this regard, according to this embodiment, the voltage of the word-line WL in the unselected memory block MB is initially increased according to the voltage increase of the columnar semiconductor CL due to capacitive coupling. Then, at time t1 or later, the charging is performed only to a voltage corresponding to the final target voltage of the columnar semiconductor CL, thereby allowing the prevention of the prolonged erasing time and the erasing operation error.

The following transistors are all NMOS transistor of the enhancement type and having a high breakdown voltage: the first word-line driving transistors Tr0 to Tr3; the second word-line driving transistors Tr10 to Tr13; the first source-side select-gate-line driving transistors Tr20 to Tr23; the second source-side select-gate-line driving transistors Tr30 to Tr33; the first drain-side select-gate-line driving transistors Tr40 to Tr43; and the second drain-side select-gate-line driving transistors Tr50 to Tr53. To allow these NMOS transistors to transfer the negative voltage VII lower than the ground voltage to the word-line WL and the select-gate-lines SGS and SGD, the transistors are provided with the negative voltage VII at their back gates. If the negative voltage transfer is unnecessary, the back gates may be connected to the ground voltage.

With reference to FIG. 5A, the first word-line driving transistors Tr0 to Tr3 are supplied with the output signal SELi at their gates. The transistors Tr0 to Tr3 are thus rendered conductive when the memory block MB is selected and are throughout kept non-conductive when the memory block MB is unselected. The drains of the first word-line driving transistors Tr0 to Tr3 are provided with the voltages $V_{CG0}$ to $V_{CG3}$, respectively. The voltages $V_{CG0}$ to $V_{CG3}$ are used to read or erase data from the word-line driver circuit 130. The sources are connected to any of the word-lines WL0 to WL3.

The second word-line driving transistors Tr10 to Tr13 are supplied with the output signal bSELi at their gates. The drains of the second word-line driving transistors Tr10 to Tr13 are provided with the voltage $V_{WLR}$ from the word-line driver circuit 130. The voltage $V_{WLR}$ is to be provided to the word-line WL in the memory block MB unselected in the erase operation. The sources are connected to any of the word-lines WL0 to WL3. The second word-line driving transistors Tr10 to Tr13 are rendered conductive at a predetermined delayed timing if the memory block MB is unselected. The transistors Tr10 to Tr13 are throughout kept non-conductive if the memory block MB is selected.

The first source-side select-gate-line driving transistors Tr20 to Tr23 are supplied with the output signal SELi at their gates. The drains of the first source-side select-gate-line driving transistors Tr20 to Tr23 are provided with the voltages $V_{SGS0}$ to $V_{SGS3}$, respectively, from the select-gate-line driver circuit 140. The voltages $V_{SGS0}$ to $V_{SGS3}$ are to render the source-side select transistors SSTr0 to SSTr3 conductive, respectively. The sources of the transistors Tr20 to Tr23 are connected to any of the source-side select-gate-lines SGS0 to SGS3.

The second source-side select-gate-line driving transistors Tr30 to Tr33 are supplied with the output signal bSELi at their gates. The drains of the second source-side select-gate-line driving transistors Tr30 to Tr33 are provided with the voltage $V_{SGSR}$ from the select-gate-line driver circuit 140. The voltage $V_{SGSR}$ is to be provided to the source-side select-gate-lines SGS0 to SGS3 of the memory block MB unselected in the erase operation. The sources are connected to any of the source-side select-gate-lines SGS0 to SGS3.

The first drain-side select-gate-line driving transistors Tr40 to Tr43 are supplied with the output signal SELi at their gates. The drains of the first drain-side select-gate-line driving transistors Tr40 to Tr43 are provided with the voltages $V_{SGD0}$ to $V_{SGD3}$, respectively, from the select-gate-line driver circuit 140. The voltages $V_{SGD0}$ to $V_{SGD3}$ are to render the drain-side select transistors SDTr0 to SDTr3 conductive, respectively. The sources of the transistors Tr40 to Tr43 are connected to any of the source-side select-gate-lines SGD0 to SGD3.

The second drain-side select-gate-line driving transistors Tr50 to Tr53 are supplied with the output signal bSELi at their gates. The drains of the second drain-side select-gate-line driving transistors Tr50 to Tr53 are provided with the voltage $V_{SGDR}$ from the select-gate-line driver circuit 140. The voltage $V_{SGDR}$ is to be provided to the drain-side select-gate-lines SGD0 to SGD3 of the memory block MB unselected in the erase operation. The sources are connected to any of the drain-side select-gate-lines SGD0 to SGD3.

Figure 6A:
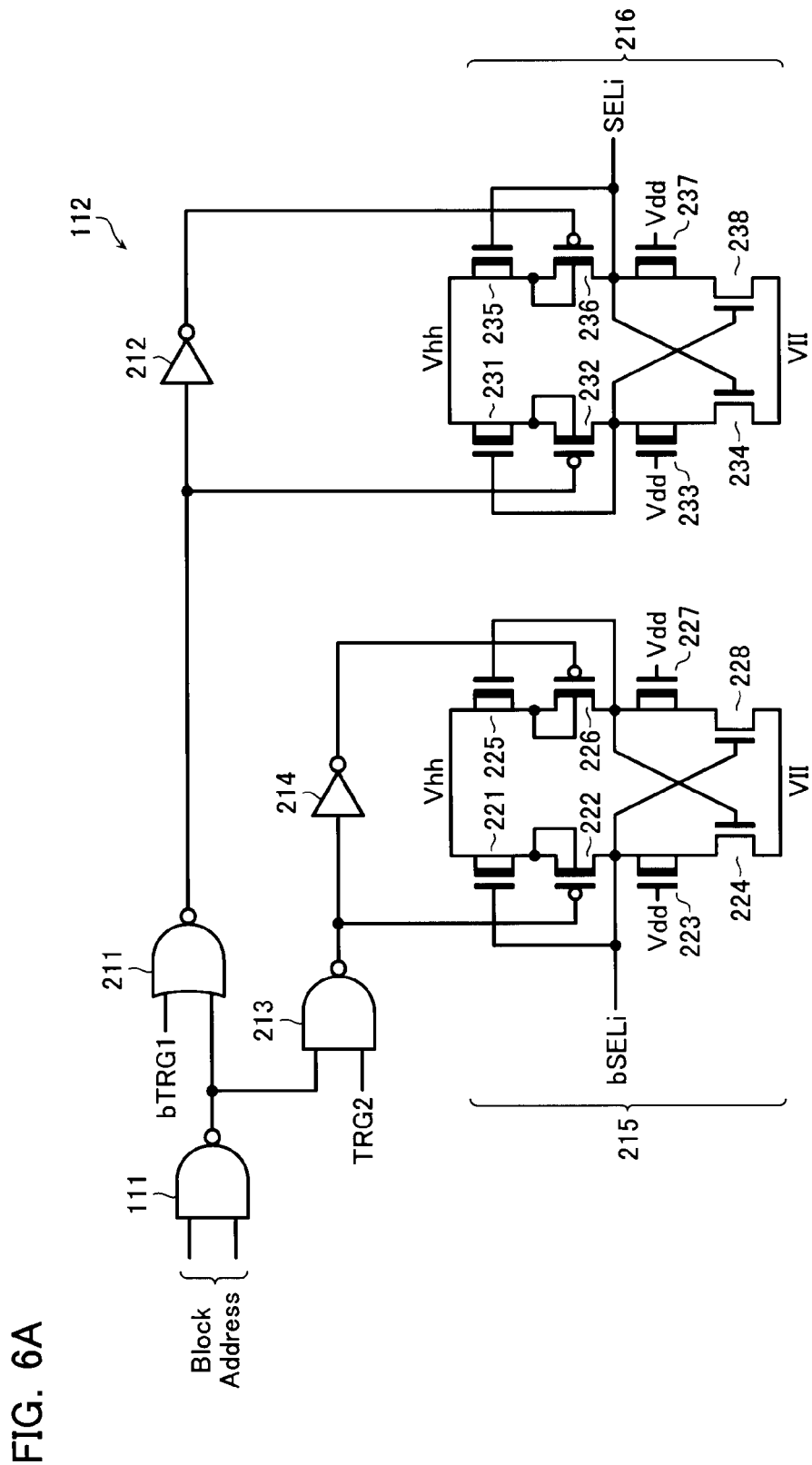
FIG. 6A is an equivalent circuit diagram showing a specific example configuration of the level shifter circuit 112 in FIG. 5A.

FIG. 6A shows an equivalent circuit diagram of a specific example configuration of the level shifter 112, along with the block decoder 111. The level shifter 112 includes a NOR gate 211, an inverter 212, a NAND gate 213, an inverter 214, and level shifter circuits 215 and 216.

The NOR gate 211 receives an output signal of the block decoder 111 and the trigger signal bTRG1. The output terminal of the NOR gate 211 is connected to the input terminal of the inverter 212. The NAND gate 213 is supplied with the trigger signal TRG2 and the output signal of the block decoder 111 as input signals. The output terminal of the NAND gate 213 is connected to the input terminal of the inverter 214.

Figure 6B:
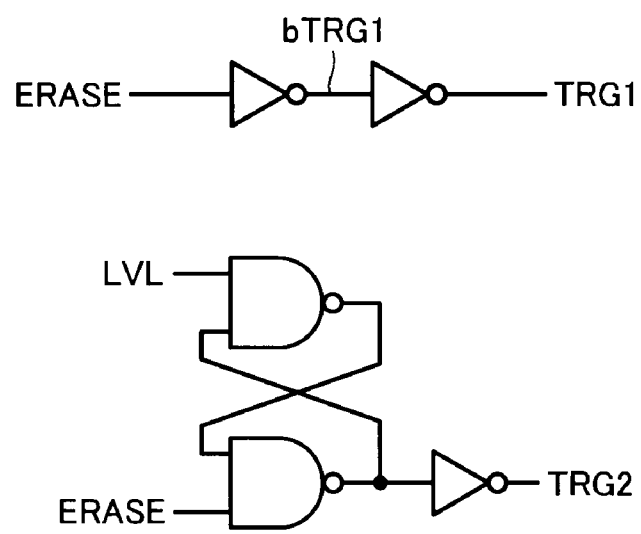
FIG. 6B is an example configuration of a signal generation circuit for generating signals TRG1 and TRG2 in the circuit in FIG. 6A.

Depending on the input and output signals of the inverter 214, the level shifter circuit 215 changes the voltage level of the output signal bSELi between the voltages Vhh and VII at a predetermined timing. Depending on the input and output signals of the inverter 212, the level shifter circuit 216 changes the voltage level of the output signal SELi between the voltages Vhh and VII at a predetermined timing. The trigger signals TRG2 and bTRG1 are signals that are triggered by the erase command ERASE and are generated by the circuit in FIG. 6B, for example.

The level shifter circuits 215 and 216 will be described below with respect to their specific configurations.

The level shifter circuit 215 includes a depression type (D-type) NMOS transistor 221, an enhancement type (E-type) PMOS transistor 222, a D-type NMOS transistor 223, and an E-type NMOS transistor 224. All transistors 221-224 are connected in series between the power supply terminal of the voltage Vhh and the power supply terminal of the voltage VII. The gate of the transistor 221 is connected to the output terminal of the signal bSEL. The gate of the transistor 222 is connected to the input terminal of the inverter 214. The drain of the transistor 222 is connected to the output terminal of the signal bSEL. The transistor 223 is provided with the power supply voltage Vdd at its gate. The source of the transistor 224 is provided with the voltage VII.

The level shifter circuit 215 also includes a D-type NMOS transistor 225, an E-type PMOS transistor 226, a D-type NMOS transistor 227, and an E-type NMOS transistor 228. All transistors 225-228 are connected in series between the power supply terminal of the voltage Vhh and the power supply terminal of the voltage VII.

The gate of the transistor 225 is connected to the connection node between the transistors 226 and 227 and the gate of the transistor 224. The gate of the transistor 226 is connected to the output terminal of the inverter 214. The transistor 227 is provided with the power supply voltage Vdd at its gate. The source of the transistor 228 is provided with the voltage VII. The gate of the transistor 228 is connected to the output terminal of the output signal bSELi.

Note that the level shifter circuit 216 includes transistors 231 to 238 similar to the transistors 221 to 228, respectively. The level shifter circuit 216 operates generally in the same way as the level shifter circuit 215. The level shifter 112 of the above configuration may be used to generate the signals SELi and bSELi as shown in FIG. 5B.

Figure 7:
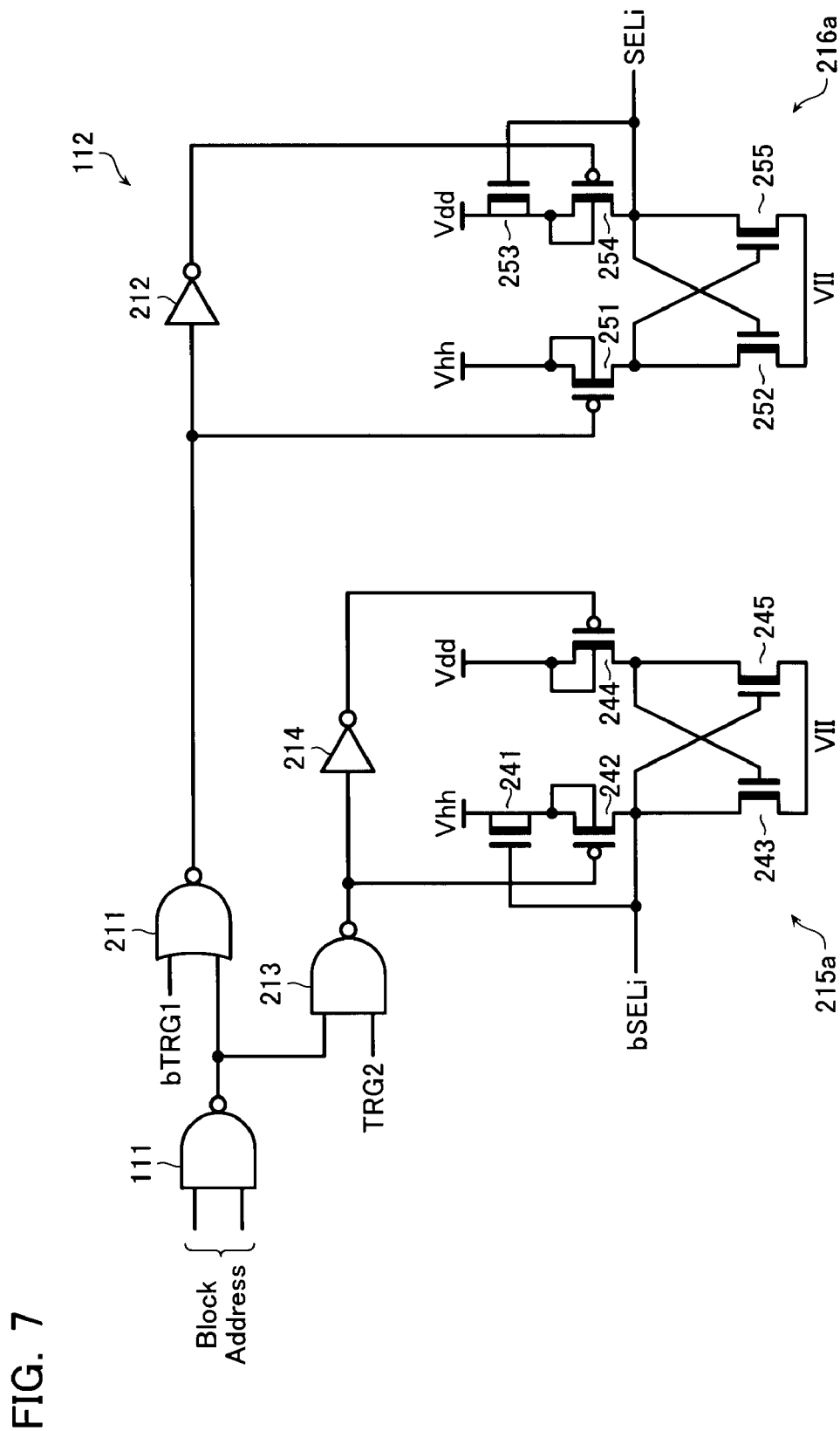
FIG. 7 is an equivalent circuit diagram showing another specific example configuration of the level shifter circuit 112 in FIG. 5A.

FIG. 7 shows another example configuration of the level shifter 112. In FIG. 7, level shifter circuits 215a and 216a have different configurations from the circuits in FIG. 6A.

The level shifter circuit 215a includes a D-type NMOS transistor 241, an E-type PMOS transistor 242, and an E-type NMOS transistor 243. The transistors 241-243 are connected in series between the power supply terminal of the voltage Vhh and the power supply terminal of the voltage VII. The gate of the transistor 241 is connected to the output terminal of the signal bSEL. The gate of the transistor 242 is connected to the input terminal of the inverter 214. The drain of the transistor 242 is connected to the output terminal of the signal bSELi. The source of the transistor 243 is provided with the voltage VII.

The level shifter circuit 215a also includes an E-type PMOS transistor 244 and an E-type NMOS transistor 245. The transistors 244, 245 are connected in series between the power supply terminal of the voltage Vhh and the power supply terminal of the voltage VII. The source of the transistor 244 is supplied with the power supply voltage Vdd. The gate of the transistor 244 is connected to the output terminal of the inverter 214. The source of the transistor 245 is provided with the voltage VII. The gate of the transistor 245 is connected to the output terminal of the output signal bSELi.

Note that the level shifter circuit 216a includes transistors 251 to 255 similar to the transistors 241 to 245, respectively. The level shifter circuit 216a operates generally in the same way as the level shifter circuit 215a. The level shifter 112 of the above configuration may be used to generate the signals SELi and bSELi as shown in FIG. 5B.

Figure 8:
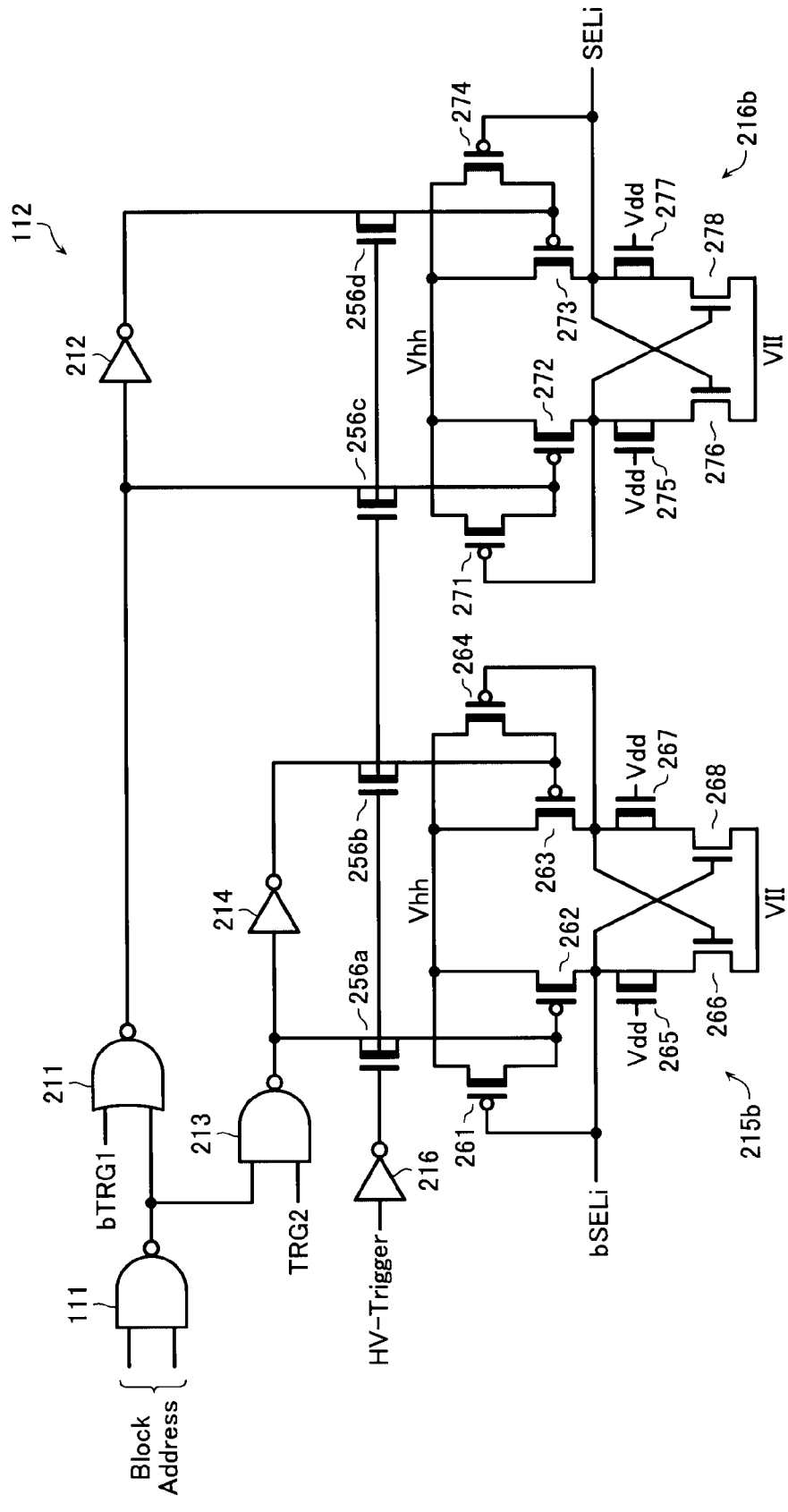
FIG. 8 is an equivalent circuit diagram showing a still another specific example configuration of the level shifter circuit 112 in FIG. 5A.

FIG. 8 shows still another example configuration of the level shifter 112. In FIG. 8, level shifter circuits 215b and 216b have different configurations from the circuits in FIG. 6A and FIG. 7.

The level shifter circuit 215b includes an E-type PMOS transistor 261. The circuit 215b also includes an E-type PMOS transistor 262, a D-type NMOS transistor 265, and an E-type NMOS transistor 266. The three transistors 262, 265, 266 are connected in series between the power supply terminal of the voltage Vhh and the power supply terminal of the voltage VII.

The level shifter circuit 215b also includes an E-type PMOS transistor 264. The circuit 215b also includes an E-type PMOS transistor 263, a D-type NMOS transistor 267, and an E-type NMOS transistor 268. The three transistors 263, 267, 268 are connected in series between the power supply terminal of the voltage Vhh and the power supply terminal of the voltage VII.

The transistor 261 is supplied with the voltage Vhh at its source. The transistor 261 is also supplied with the output signal bSELi at its gate. The drain of the transistor 261 is connected to the gate of the transistor 262. The drain of the transistor 261 is also connected to the input terminal of the inverter 214 via a D-type NMOS transistor 256a. The gate of the transistor 256a are connected to the output terminal of the inverter 216 as well as the gates of D-type NMOS transistors 256b to 256d. The input terminal of the inverter 216 receives a trigger signal HV-Trigger that changes to "H" at a predetermined timing. When the potential of the voltage Vhh generated inside the semiconductor memory device generally exceeds the power supply voltage Vdd, the trigger signal HV-Trigger changes to "L," thereby decreasing the conductance of the transistors 256a to 256d.

Depending on the values of the block addresses and the trigger signals bTRG1 and TRG2, the gate of the transistor 262 or 263 and the gate of the transistor 272 or 273 are charged to the voltage Vhh by the transistor 261 or 264 and 271 or 274, respectively. The transistors 256a to 256d decreasing in their conductance may prevent those gates from being discharged to the power supply voltage Vdd.

The gate of the transistor 262 is connected to the input terminal of the inverter 214. The drain of the transistor 262 is connected to the output terminal of the signal bSEL. The gate of the transistor 265 is supplied with the power supply voltage Vdd. The source of the transistor 266 is provided with the voltage VII.

The source of the transistor 264 is supplied with the voltage Vhh. The gate of the transistor 264 is connected to the connection node between the gate of the transistor 266 and the transistors 263 and 267. The drain of the transistor 264 is connected to the gate of the transistor 263.

The transistor 263 is supplied with the voltage Vhh at its source. The gate of the transistor 263 is connected to the output terminal of the inverter 214 via the D-type NMOS transistor 256b. The gate of the transistor 267 is supplied with the power supply voltage Vdd. The source of the transistor 268 is provided with the voltage VII. The gate of the transistor 268 is connected to the output terminal of the output signal bSELi.

Note that the level shifter circuit 216b includes the transistors 271 to 278 connected in a similar way to the transistors 261 to 268. The gate of the transistor 274 and the connection node between the transistors 273 and 277 each work as the output terminal of the output signal SELi. The level shifter circuit 216b operates generally in the same way as the level shifter circuit 215b. The level shifter 112 of the above configuration may be used to generate the signals SELi and bSELi as shown in FIG. 5B.

Figure 9:
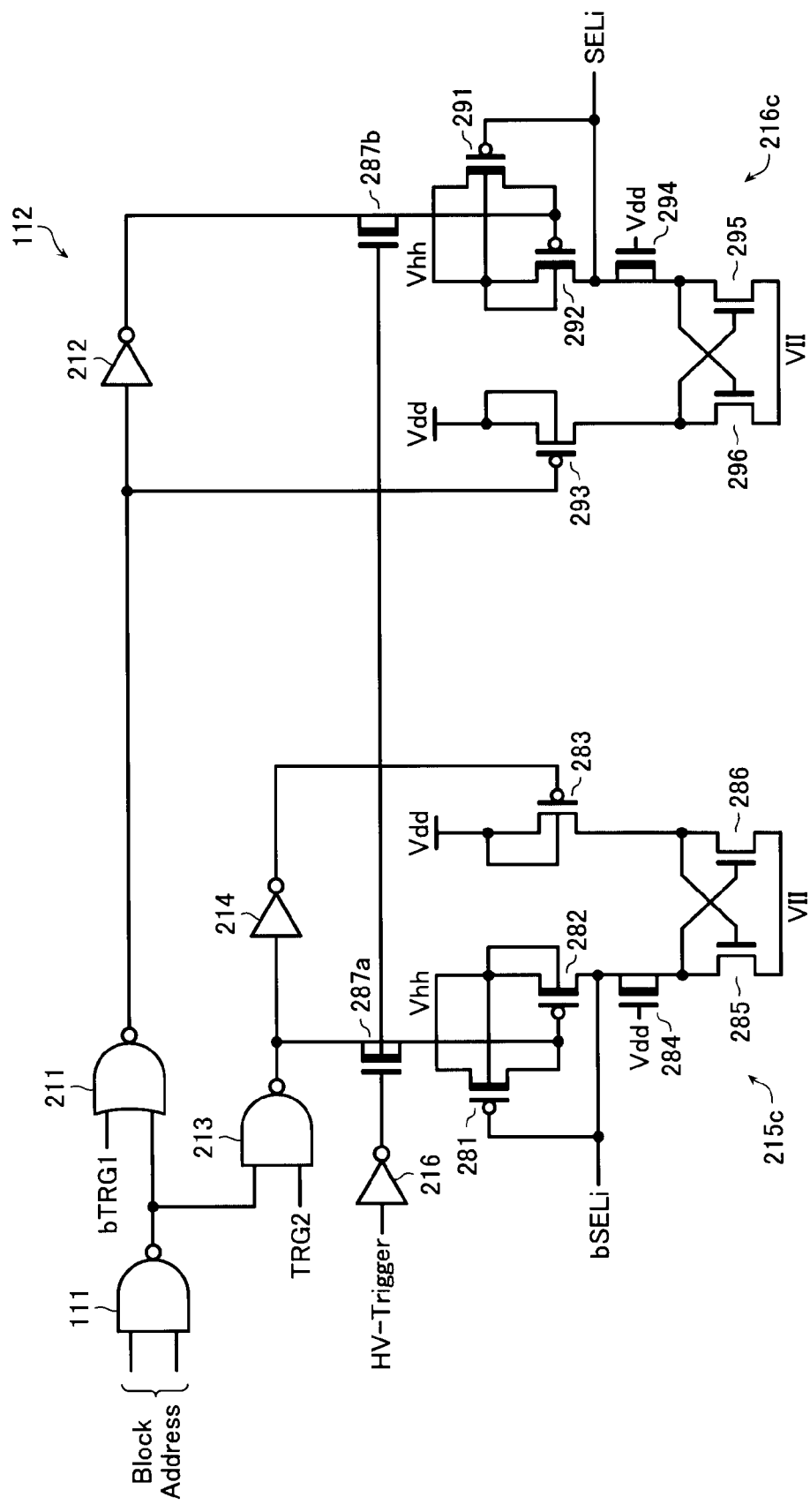
FIG. 9 is an equivalent circuit diagram showing a still another specific example configuration of the level shifter circuit 112 in FIG. 5A.

FIG. 9 shows still another example configuration of the level shifter 112. In FIG. 9, level shifter circuits 215c and 216c have different configurations from the circuits in FIG. 6A, FIG. 7, and FIG. 8.

The level shifter circuit 215c includes an E-type PMOS transistor 281. The circuit 215c also includes an E-type PMOS transistor 282, a D-type NMOS transistor 284, and an E-type NMOS transistor 285. The three transistors 282, 284 285 are connected in series between the power supply terminal of the voltage Vhh and the power supply terminal of the voltage VII.

The level shifter circuit 215c also includes an E-type PMOS transistor 283 and an E-type NMOS transistor 286. Those transistors 283, 286 are connected in series between the power supply terminal of the voltage Vdd and the power supply terminal of the voltage VII.

The transistor 281 is supplied with the voltage Vhh at its source. The gate of the transistor 281 is supplied with the output signal bSELi. The drain of the transistor 281 is connected to the gate of the transistor 282. The drain of the transistor 281 is connected to the input terminal of the inverter 214 via a D-type NMOS transistor 287a. The gate of the transistor 287a are connected to the output terminal of the inverter 216 as well as the gate of the D-type NMOS transistor 287b. The input terminal of the inverter 216 receives the trigger signal HV-Trigger that changes to "H" at a predetermined timing. When the potential of the voltage Vhh generated inside the semiconductor memory device generally exceeds the power supply voltage Vdd, the trigger signal HV-Trigger changes to "L", thereby decreasing the conductance of the transistors 287a to 287b.

Depending on the values of the block addresses and the trigger signals bTRG1 and TRG2, the gate of the transistor 282 or 292 is charged to the voltage Vhh by the transistor 281 or 291, respectively. The transistors 287a to 287b decreasing in their conductance may prevent those gates from being discharged to the power supply voltage Vdd.

The gate of the transistor 282 is connected to the input terminal of the inverter 214 via the transistor 287a. The drain of the transistor 282 is connected to the output terminal of the signal bSEL. The gate of the transistor 284 is supplied with the power supply voltage Vdd. The source of the transistor 285 is provided with the voltage VII.

The source of the transistor 283 is supplied with the power supply voltage Vdd. The gate of the transistor 283 is connected to the output terminal of the inverter 214. The source of the transistor 286 is provided with the voltage VII. The gate of the transistor 286 is connected to the connection node between the transistors 284 and 285.

Note that the level shifter circuit 216c includes transistors 291 to 296 connected in a similar way to the transistors 281 to 266. The gate of the transistor 291 and the connection node between the transistors 292 and 294 each work as the output terminal of the output signal SELi. The level shifter circuit 216c operates generally in the same way as the level shifter circuit 215c. The level shifter 112 of the above configuration may be used to generate the signals SELi and bSELi as shown in FIG. 5B.

Figure 10:
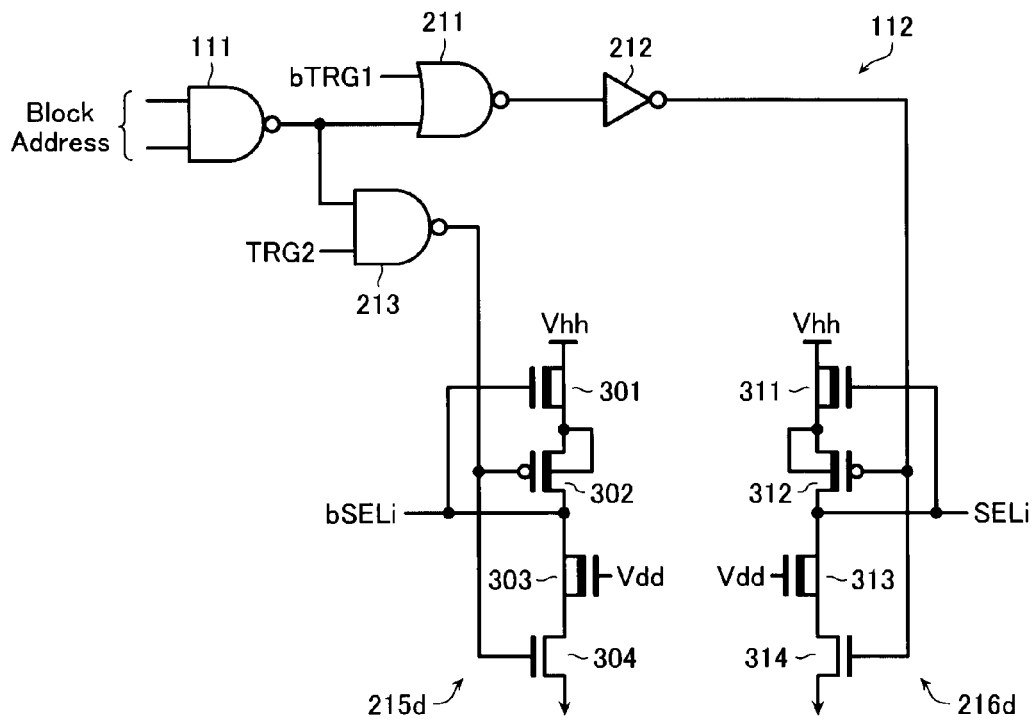
FIG. 10 is an equivalent circuit diagram showing a still another specific example configuration of the level shifter circuit 112 in FIG. 5A.

FIG. 10 shows still another example configuration of the level shifter 112. In FIG. 10, level shifter circuits 215d and 216d have different configurations from the circuits in FIG. 6A, FIG. 7, FIG. 8, and FIG. 9.

The level shifter circuit 215d includes a D-type NMOS transistor 301, an E-type PMOS transistor 302, a D-type NMOS transistor 303, and E-type NMOS transistor 304. All transistors 301-304 are connected in series between the power supply terminal of the voltage Vhh and the ground terminal.

The transistor 301 is supplied with the voltage Vhh at its drain. The gate of the transistor 301 is supplied with the output signal bSELi. The source of the transistor 301 is connected to the source of the transistor 302. The gate of the transistor 302 is connected to the output terminal of the NAND gate 213. The source of the transistor 302 is connected to the output terminal of the signal bSELi. The gate of the transistor 303 is supplied with the power supply voltage Vdd. The source of the transistor 304 is provided with the voltage VII. The gate the transistor 304 is provided with the output signal of the NAND gate 213. Note that the level shifter circuit 216d has the same configuration as the level shifter 215 as described above. Note, however, that the gates of the transistors 312 and 314 are connected to the output terminal of the inverter 212.

Figure 11A:
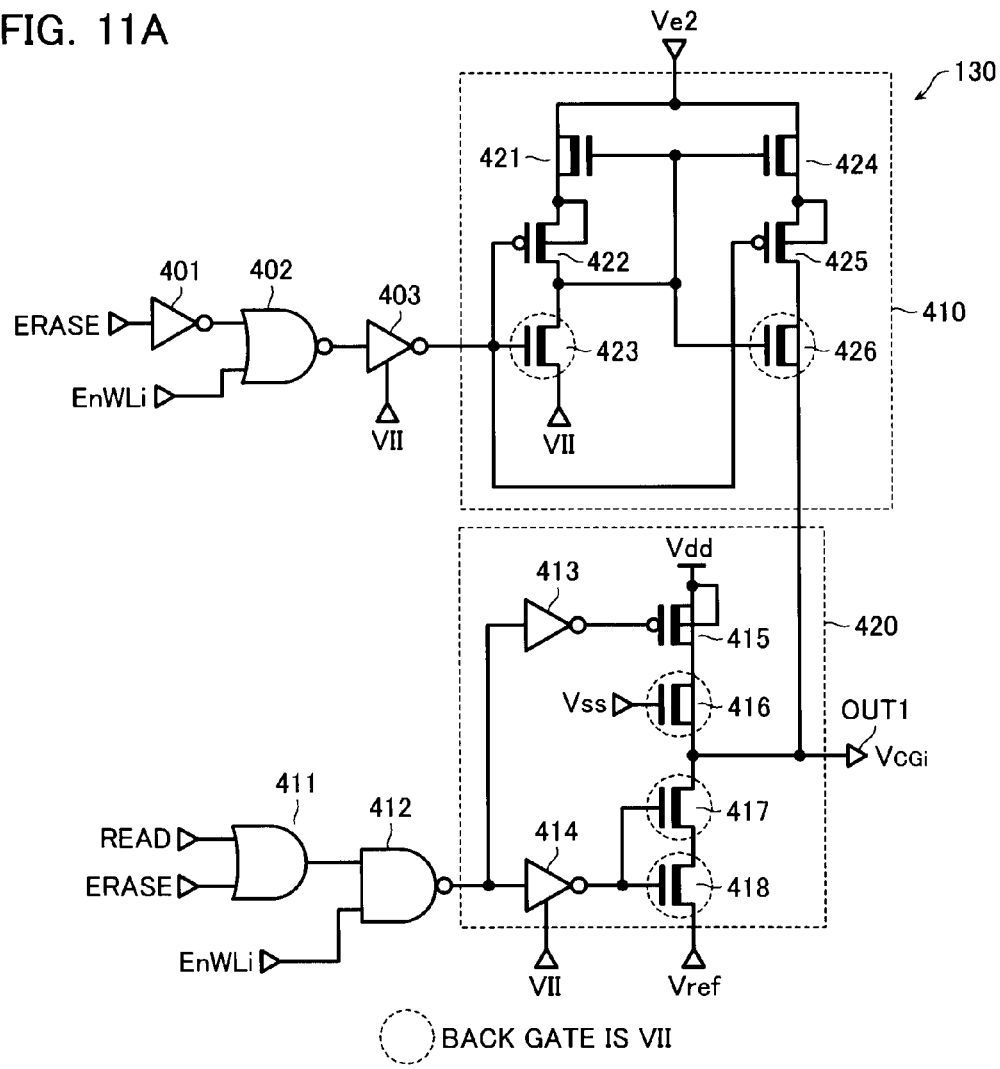
FIG. 11A is an equivalent circuit diagram showing a specific example configuration of the word-line driver circuit 130.
Figure 11B:
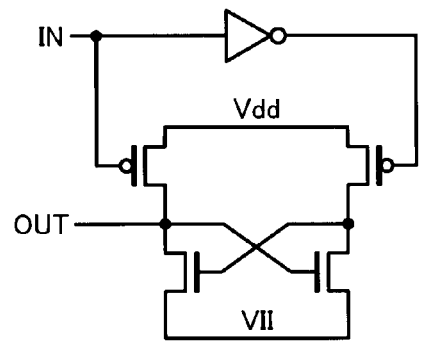
FIG. 11B is an equivalent circuit diagram showing an example configuration of the inverter 403 in FIG. 11A.
Figure 12:
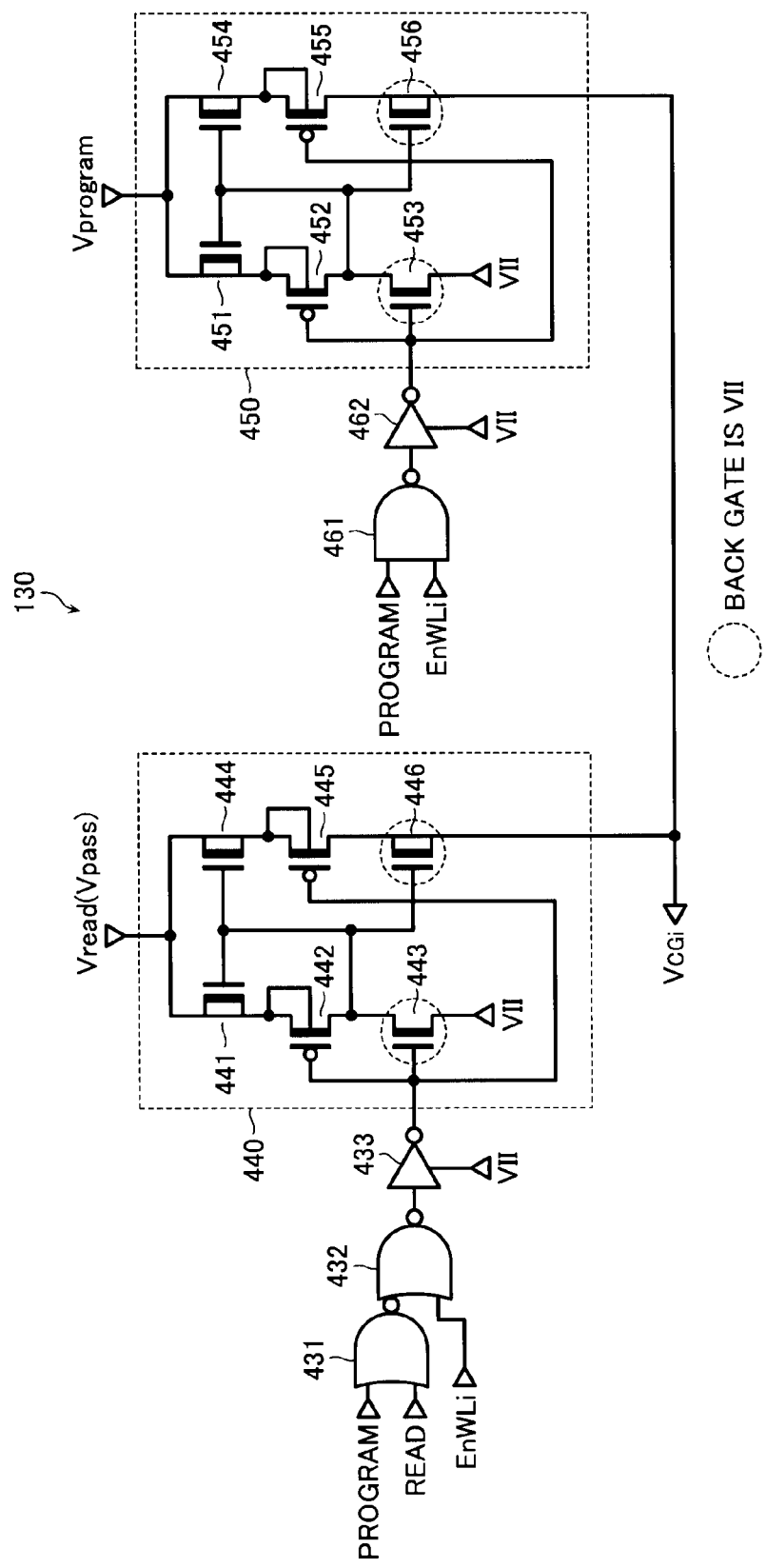
FIG. 12 is an equivalent circuit diagram of a specific example configuration of the word-line driver circuit 130.
Figure 13:
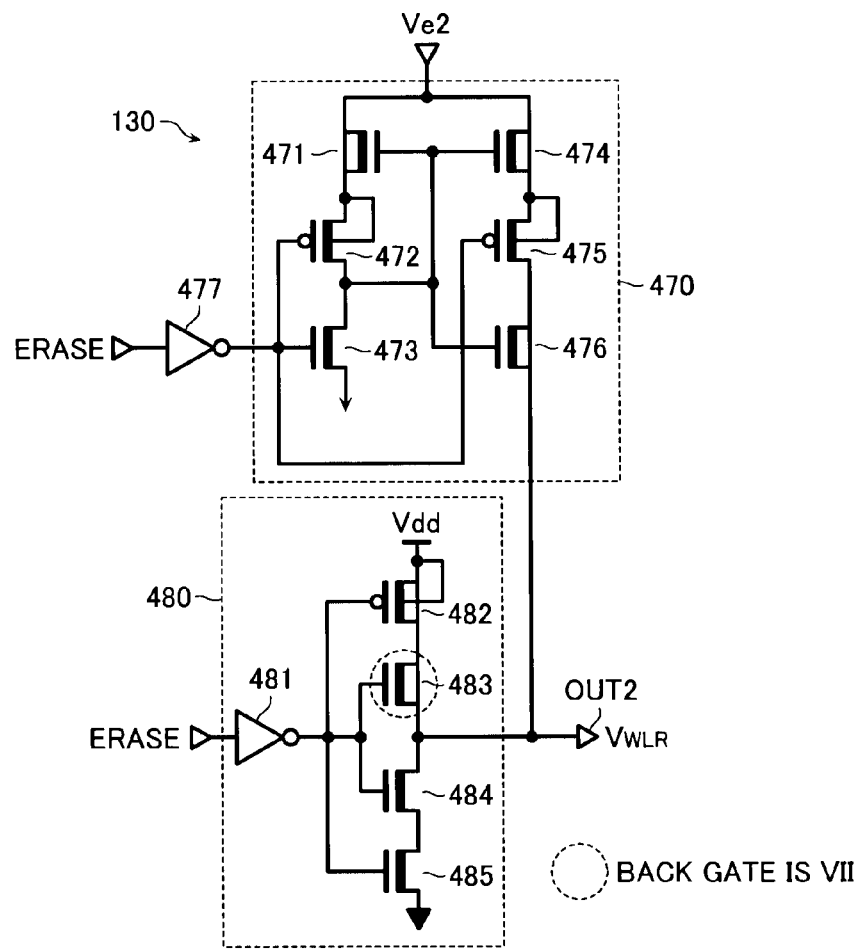
FIG. 13 is an equivalent circuit diagram showing a specific example configuration of the word-line driver circuit 130.

Referring now to FIG. 11A to FIG. 13, specific example configurations of the word-line driver circuit 130 will be described. FIG. 11A shows the configurations of two circuits of the word-line driver circuit 130: a circuit for supplying a boosted voltage Ve2 to the unselected word-line WL in the selected block MB in the erase operation; and a circuit for providing the power supply voltage Vdd to the unselected word-line WL before the word-line WL is boosted to the boosted voltage Ve2. FIG. 11B is a circuit diagram of a specific example configuration of the inverter 403 in FIG. 11A. FIG. 12 shows the configurations of another two circuits of the word-line driver circuit 130: a circuit for providing the read-pass voltage Vread to the unselected word-line WL in the read operation; and a circuit for applying a write voltage Vpass to the selected word-line WL in the write operation. FIG. 13 is a circuit diagram of a circuit for providing the boosted voltage Ve2 to the word-line WL in the unselected memory block MB after the period of the floating state has elapsed in the erase operation.

The circuit in FIG. 11A includes an inverter 401, a NOR gate 402, an inverter 403, a level shifter circuit 410, an OR gate 411, a NAND gate 412, and a level shifter circuit 420.

The input terminal of the inverter 401 receives an erase command ERASE that changes to "H" in the erase operation. The NOR gate 402 receives the output signal of the inverter 401 and the selection signal EnWLi that changes to "H" when selecting a predetermined word-line WLi. The inverter 403 is provided with the output signal from the NOR gate 402 as an input signal. With reference to FIG. 11B, the inverter 403 is configured to oscillate between the power supply voltage Vdd and the negative voltage VII.

The OR gate 411 receives the read command READ that changes to "H" in the read operation and an erase command ERASE. The NAND gate 412 receives the output signal of the OR gate 411 and the selection signal EnWLi.

The level shifter circuit 410 includes a D-type NMOS transistor 421, an E-type PMOS transistor 422, and an E-type NMOS transistor 423. These transistors 421-423 are connected in series between the terminal of the boosted voltage Ve2 and the terminal of the voltage VII. The gate of the transistor 421 is connected to the gates of the transistors 424 and 426 as described below and the connection node between the transistors 422 and 423. The gate of the transistor 422 is provided with the output signal of the inverter 403. The transistor 423 is provided with the output signal of the inverter 403 at its gate. The transistor 423 is also provided with the voltage VII at its back gate.

The level shifter 410 includes, between the terminal of the boosted voltage Ve2 and the output terminal OUT1, a D-type NMOS transistor 424, an E-type PMOS transistor 425, and a D-type NMOS transistor 426. These transistors 424-426 are connected in series between the terminal of the boosted voltage Ve2 and the output terminal OUT1.

The gate of the transistor 425 is provided with the output signal of the inverter 403. The gate of the transistor 426 is connected to the connection node of the transistors 422 and 423.

The level shifter circuit 420 includes inverters 413 and 414, a D-type PMOS transistor 415, a D-type NMOS transistor 416, E-type NMOS transistors 417 and 418. These transistors 413-418 are connected in series between the power supply terminal of the power supply voltage Vdd and the power supply terminal for supplying the reference voltage Vref. Note that the reference voltage Vref is used as, in this embodiment, a read voltage applied to the selected word-line in the read operation.

The inverters 413 and 414 receive the output signal of the NAND gate 412. The transistor 415 receives the output signal of the inverter 413. The gate of the transistor 416 is provided with the ground voltage Vss. The transistors 417 and 418 are each supplied with the output signal of the inverter 414 at their gates. Note that the transistors 416 to 418 are each supplied with the negative voltage VII at their back gates.

The configuration of the circuit in FIG. 12 will now be described. The circuit in FIG. 12 includes NOR gates 431 and 432, an inverter 433, a level shifter circuit 440, a NAND gate 461, an inverter 462, and a level shifter circuit 450.

The NOR gate 431 receives, as an input signal, the write command PROGRAM that changes to "H" in the write operation, and the read command READ. The NOR gate 432 receives the output signal of the NOR gate 431, and the selection signal EnWLi for selecting a predetermined word-line WL. The inverter 433 has the structure shown in FIG. 11B, and is provided with the output signal of the NOR gate 432.

The level shifter circuit 440 includes a D-type NMOS transistor 441, an E-type PMOS transistor 442, an E-type NMOS transistor 443, a D-type NMOS transistor 444, an E-type PMOS transistor 445, and a D-type NMOS transistor 446. Note that the transistors 443 and 446 are provided with the voltage VII at their back gates.

The transistors 441 to 443 are connected in series between two power supply terminals. The first terminal is to provide the read-pass voltage Vread supplied to the unselected word-line WL in the read operation, or the write path voltage Vpass supplied to the unselected word-line in the write operation. The second terminal is to provide the voltage VII. The transistors 444 to 446 are connected in series between the power supply terminal providing the voltage Vread or the voltage Vpass and the output terminal.

The gate of the transistor 441 is connected to the gates of the transistors 444 and 446 and is also connected to the connection node of the transistors 442 and 443. The gates of the transistors 442 and 443 are supplied with the output signal of the inverter 433. The gate of the transistor 445 is provided with the output signal of the inverter 433. Such a configuration causes the level shifter circuit 440 to set the voltage $V_{CGi}$ provided to the unselected word-line WLi to the voltage Vread or Vpass in the read operation and the write operation and when the corresponding word-line WLi in the selected memory block MB is unselected.

The NAND gate 461 receives, as an input signal, the write command PROGRAM that changes to "H" in the write operation, and the selection signal EnWLi. The inverter 462 has the structure shown in FIG. 11B and is provided with the output signal of the NAND gate 461.

The level shifter circuit 450 has the same structure as the level shifter circuit 440. The transistors 451 to 456 shown in FIG. 12 correspond to the respective transistors 441 to 446. The level shifter circuit 450 sets the voltage $V_{CGi}$ provided to the selected word-line WLi to the voltage Vprogram in the write operation and when the corresponding word-line WLi is selected.

Referring now to FIG. 13, a specific example configuration of a circuit of the word-line driver circuit 130 for generating the voltage $V_{WLR}$ of will be described. The word-line driver circuit 130 includes an inverter 477, a level shifter circuit 470, and a level shifter circuit 480.

The inverter 477 receives the erase command ERASE at its input terminal. The level shifter circuit 470 has the same structure as the level shifter circuit 440. The transistors 471 to 476 shown in FIG. 13 correspond to the above respective transistors 441 to 446. Note, however, that the voltage provided to the drains of the transistors 471 and 474 are the boosted voltage Ve2. The source of the transistor 473 is connected to the ground terminal. The source of the transistor 476 is connected to the output terminal OUT2. The output signal of the output terminal OUT2 is supplied to the row decoder 110 as the voltage $V_{WLR}$.

The level shifter circuit 480 includes an inverter 481, a D-type PMOS transistor 482, a D-type NMOS transistor 483, and E-type NMOS transistors 484 and 485. Note that the transistor 483 is supplied with the voltage VII at its back gate.

The inverter 481 receives the erase command ERASE and outputs the inverted signal to the gates of the transistors 482 to 485. The transistors 482 to 485 are connected in series between the terminal of the power supply voltage Vdd and the ground terminal. The connection node between the transistors 483 and 484 works as the output terminal OUT2. The level shifter circuit 480 supplies the power supply voltage Vdd to the output terminal OUT2, when the erase command ERASE is "H". The level shifter circuit 470 supplies the boosted voltage Ve2 to the output terminal OUT2, when the erase command ERASE is "H". Thus, in the erase operation, the circuit shown in FIG. 13 supplies the power supply voltage Vdd from the level shifter circuit 480 until the voltage level of the boosted voltage Ve2 increases to the power supply voltage Vdd. Then the circuit supplies the boosted voltage Ve2 from the level shifter 470 when the boosted voltage Ve2 exceeds the power supply voltage Vdd.

Figure 14:
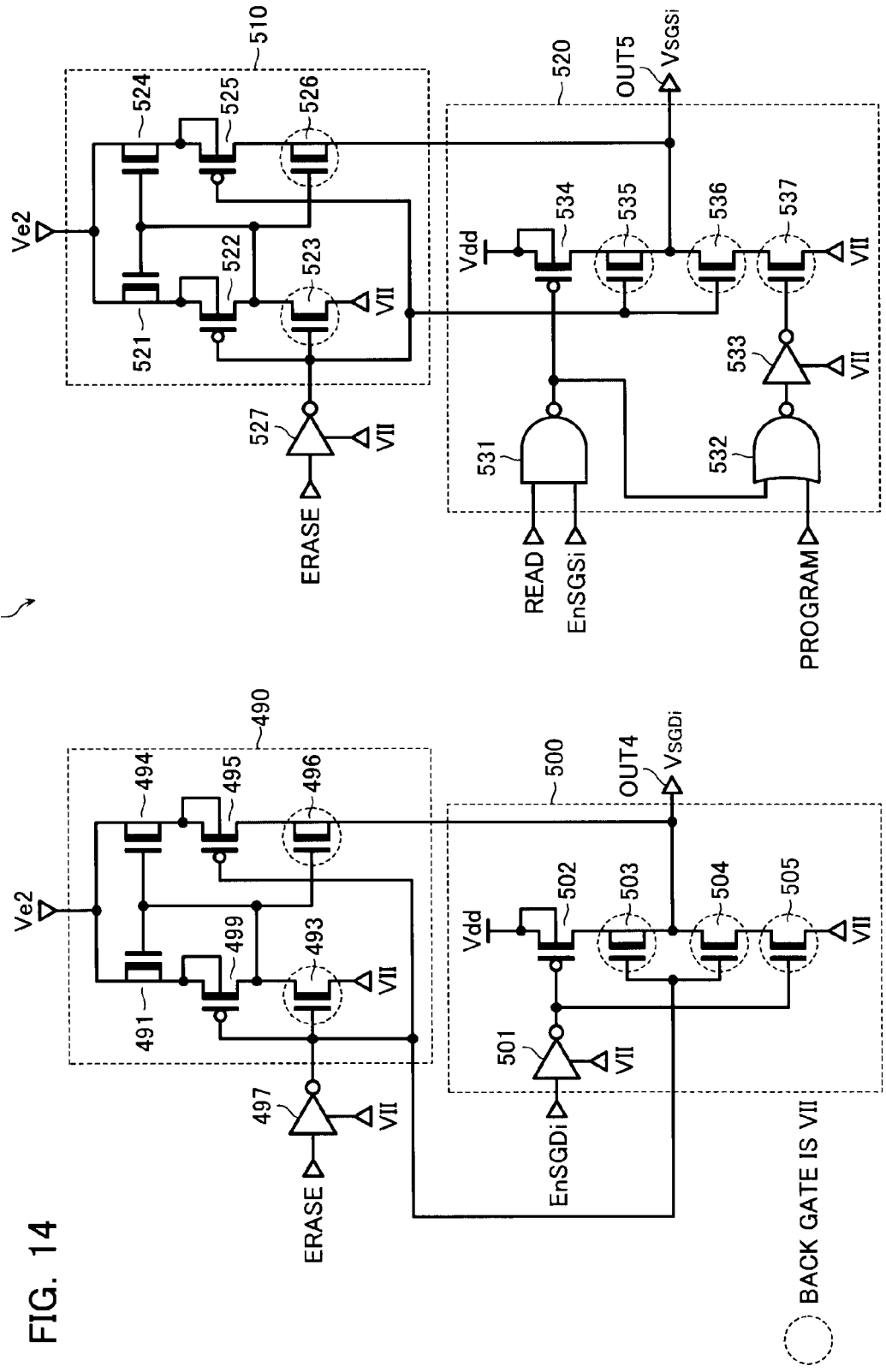
FIG. 14 is an equivalent circuit diagram showing a specific example configuration of the select-gate-line driver circuit 140.

Referring now to FIG. 14, a specific example configuration of the select-gate-line driver circuit 140 will be described. The select-gate-line driver circuit 140 includes inverters 497 and 527 and level shifter circuits 490, 500, 510, and 520.

The inverter 497 receives the erase command ERASE at its input terminal. The level shifter circuit 490 has the same structure as the level shifter circuit 440. The transistors 491 to 496 shown in FIG. 14 correspond to the above respective transistors 441 to 446. The source of the transistor 496 is connected to the output terminal OUT4. The output signal of the output terminal OUT4 is supplied to the row decoder 110 as the voltage $V_{SGDi}$.

The level shifter circuit 500 includes an inverter 501, a D-type PMOS transistor 502, a D-type NMOS transistor 503, and E-type NMOS transistors 504 and 505. Note that the transistors 503 to 505 are supplied with the voltage VII at their back gates.

The inverter 501 receives the selection signal EnSGDi for selecting a drain-side select-gate-line SGDi, and outputs the inverted signal to the gates of the transistors 502 and 505. The transistors 502 to 505 are connected in series between the power supply terminal for supplying the power supply voltage Vdd and the power supply terminal for supplying the voltage VII. The connection node between the transistors 503 and 504 works as the output terminal OUT4. The transistors 503 and 504 are supplied with the output signal of the inverter 497 at their gates. Such a configuration causes the select-gate-line driver circuit 140 to set the voltage $V_{SGDi}$ from the output terminal OUT4 to the power supply voltage Vdd, when the erase command ERASE is "H" and the selection signal EnSGDi is "H". The driver circuit 140 sets the voltage $V_{SGDi}$ to the negative voltage VII, when the erase command ERASE is "H" and the selection signal EnSGDi is "L".

The inverter 527 has the structure in FIG. 11B, and receives the erase command ERASE at its input terminal. The level shifter circuit 510 has the same structure as the level shifter circuit 440. The transistors 521 to 526 shown in FIG. 14 correspond to the above respective transistors 441 to 446. The output signal of the inverter 527 is supplied to the transistors 522 and 523. The source of the transistor 526 is connected to the output terminal OUT5. The output signal of the output terminal OUT5 is supplied to the row decoder 110 as the voltage $V_{SGSi}$.

The level shifter circuit 520 includes a NAND gate 531, a NOR gate 532, an inverter 533, a D-type PMOS transistor 534, a D-type NMOS transistor 535, E-type NMOS transistors 536 and 537. Note that the transistors 535 to 537 are supplied with the voltage VII at their back gates. The inverter 533 has the structure in FIG. 11B and changes the voltage level of the output signal to the power supply voltage Vdd or the voltage VII.

The NAND gate 531 receives the read command READ and the selection signal EnSGSi as an input signal. The NOR gate 532 is supplied with the output signal of the NAND gate 531 and the write command PROGRAM as input signals. The inverter 533 inverts the output signal of the NOR gate 532.

The transistors 534 to 537 are connected in series between the terminal of the power supply voltage Vdd and the terminal of the voltage VII. The transistor 534 is supplied at its gate with the output signal of the NAND gate 531. The transistor 535 and 536 are supplied at their gates with the output signal of the inverter 527. The transistor 537 is supplied at its gate with the output signal of the inverter 533. Such a configuration causes the level shifter circuit 510 to set the voltage $V_{SGSi}$ from the output terminal OUT5 to the boosted voltage Ve2, when the erase command ERASE is "H". The source-line SLA is applied with the boosted voltage Ve1 that rises at a timing earlier than the boosted voltage Ve2. Therefore, the voltage Ve1 may generate the GIDL current and increase the potential of the columnar semiconductor CL (the potential of the body of the memory cell).

The level shifter circuit 520 sets the voltage $V_{SGSi}$ from the output terminal OUT5 to the power supply voltage Vdd, when the read command READ is "H" and the selection signal EnSGSi is "H". The circuit 520 sets the voltage $V_{SGSi}$ from the output terminal OUT5 to the power supply voltage VII, when the read command READ is "H" and the selection signal EnSGSi is "L".

Figure 15:
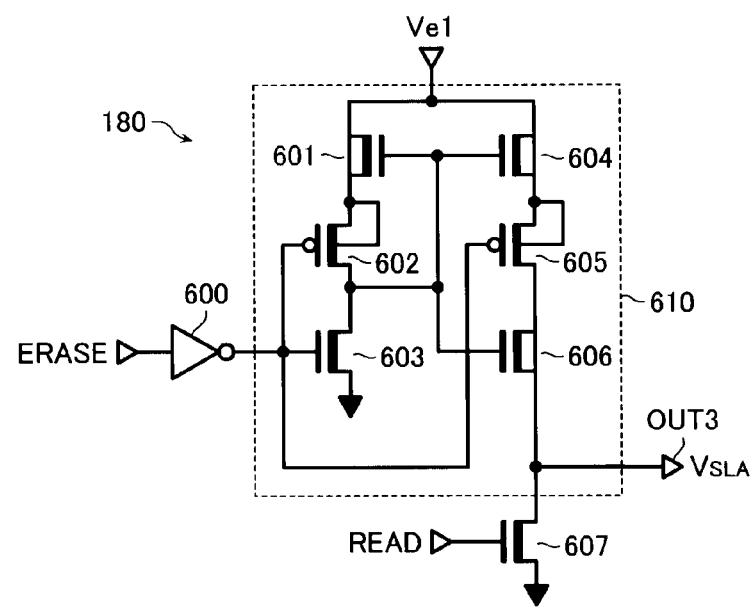
FIG. 15 is an equivalent circuit diagram showing a specific example configuration of the source-line driver circuit 180.

FIG. 15 is a circuit diagram of a specific example configuration of the source-line driver circuit 180. The source-line driver circuit includes an inverter 600 and a level shifter circuit 610.

The inverter 600 is supplied with the erase command ERASE at its input terminal. The level shifter circuit 610 has the same structure as the level shifter circuit 440. The transistors 601 to 606 shown in FIG. 15 correspond to the above respective transistors 441 to 446. The output signal of the inverter 600 is supplied to the transistors 602 and 603. The source of the transistor 606 is connected to the output terminal OUT3. The output signal of the output terminal OUT3 is supplied to the source-line SLA as a voltage $V_{SLA}$ to be supplied to the source-line SLA.

Figure 16A:
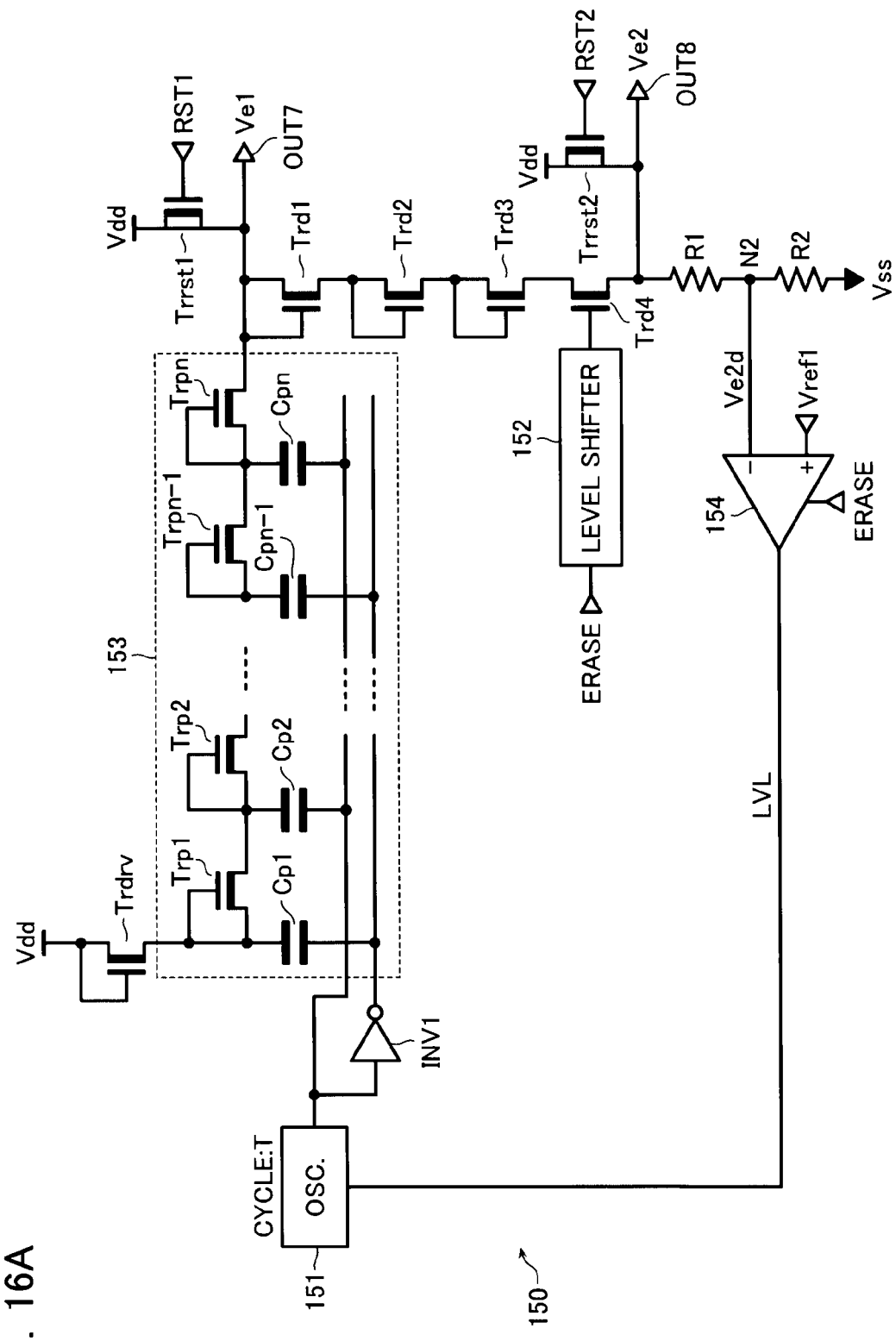
FIG. 16A is an equivalent circuit diagram showing a specific example configuration of the booster circuit 150.

FIG. 16A is a circuit diagram of a specific example configuration of the booster circuit 150. The booster circuit 150 includes an oscillator 151, an inverter INV1, a level shifter 152, a charge pump circuit 153, and an operational amplifier 154.

The charge pump circuit 153 includes NMOS transistors Trp1 to Trpn that are connected in series and diode-connected, and capacitors Cp1 to Cpn whose first ends are connected to the drains of the respective NMOS transistors. The second ends of the capacitors Cp1 to Cpn are supplied with the output signal of the oscillator 151 or the inverted signal of the output signal inverted by the inverter INV1. Thus, the charge pump circuit 153 may boost the power supply voltage Vdd supplied from the transistor Trdrv to a predetermined voltage level according to the output signal from the oscillator 151, and the charge pump circuit 153 may output the boosted voltage Ve1 from the output terminal OUT7. Note that the transistor Trrst1 (D-type) is rendered conductive by the reset signal RST1 after the operation of the booster circuit 150 ends, thereby resetting the voltage of the output terminal OUT7 to the power supply voltage Vdd.

Figure 16B:
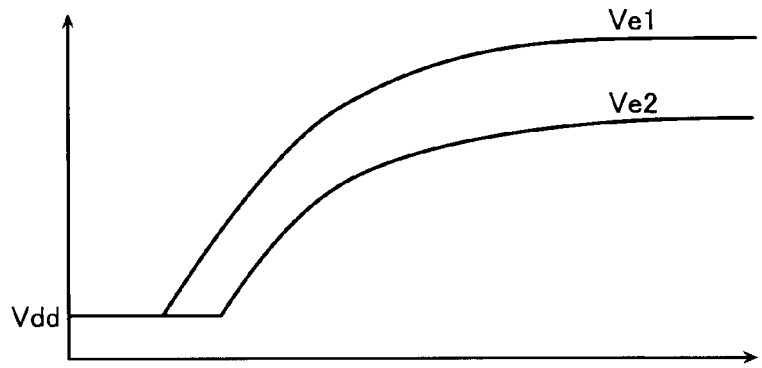
FIG. 16B shows waveforms of the boosted voltages Ve1 and Ve2 generated by the booster circuit 150.
Figure 16C:
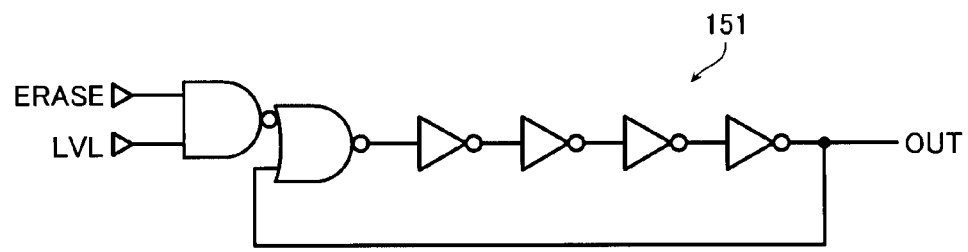
FIG. 16C is an equivalent circuit diagram showing a specific example configuration of the oscillator 151 in FIG. 15.
Figure 16D:
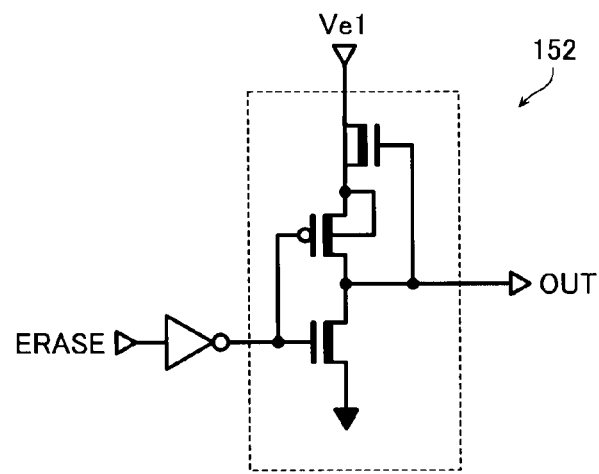
FIG. 16D is an equivalent circuit diagram of a specific example configuration of the level shifter circuit 152 in FIG. 15.

Between the output terminal OUT7 and the different output terminal OUT8, E-type NMOS transistors Trd1 to Trd3 that are diode-connected and an E-type NMOS transistor Trd4 are connected in series. The transistor Trd4 is rendered conductive by being supplied at its gate with the output voltage of the level shifter circuit 152 that operates according to the erase command ERASE. The boosted voltage Ve2 from the output terminal OUT8 is caused to be a voltage that rises later than the boosted voltage Ve1 (see FIG. 16B), by the actions of the diode-connected transistors Trd1 to Trd3. Note that the output terminal OUT8 is connected to the source of the reset transistor Trrst2 (D-type). The transistor Trrst2 is rendered conductive by the reset signal RST2 to reset the output terminal OUT8 to the power supply voltage Vdd. Note that the oscillator 151 may have the structure shown in FIG. 16C. The level shifter circuit 152 may have the structure shown in FIG. 16D, for example.

Figure 16E:
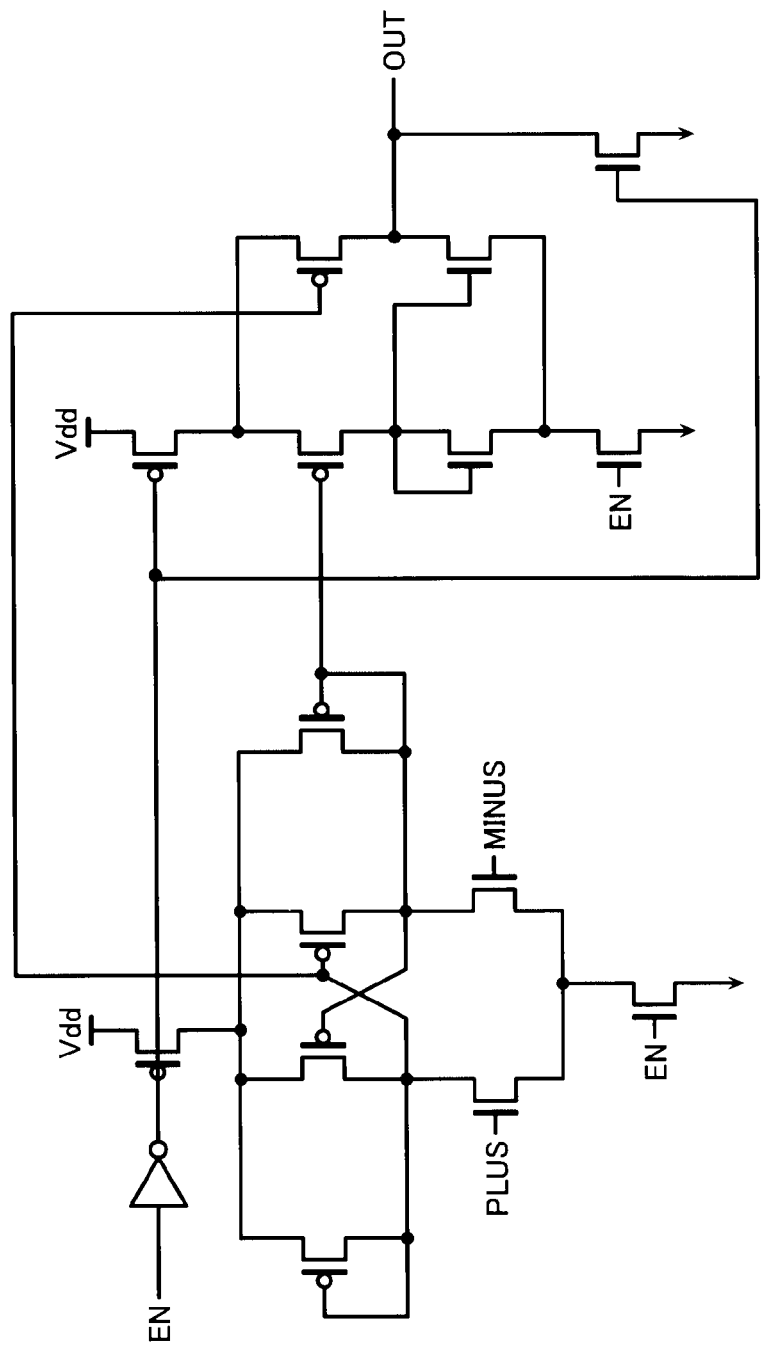
FIG. 16E is a specific example of the operational amplifier 154 in FIG. 15.

Between the output terminal OUT8 and the ground terminal, resistors R1 and R2 are connected. The connection node N2 between the resistors R1 and R2 is connected to the inverted input terminal of the operational amplifier 154. The operational amplifier 154 differentially amplifies the voltage Ve2d at the node N2 and the reference voltage Vref1 input to the non-inverting input terminal. Thus the operational amplifier 154 outputs the amplification signal LVL. When the voltage Ve2d is higher than the reference voltage Vref1, the amplification signal LVL becomes a predetermined value, which is in turn input to the oscillator 151. The oscillation operation thus stops. Note that the operational amplifier 154 may be implemented by the circuit shown in FIG. 16E, for example. The terminals PLUS and MINUS shown in FIG. 16E receive the respective voltages Ve2d and Vref1. Note that in FIG. 16E, the signal EN is an enable signal for enabling the start of the operation of the operational amplifier 154.

Figure 17:
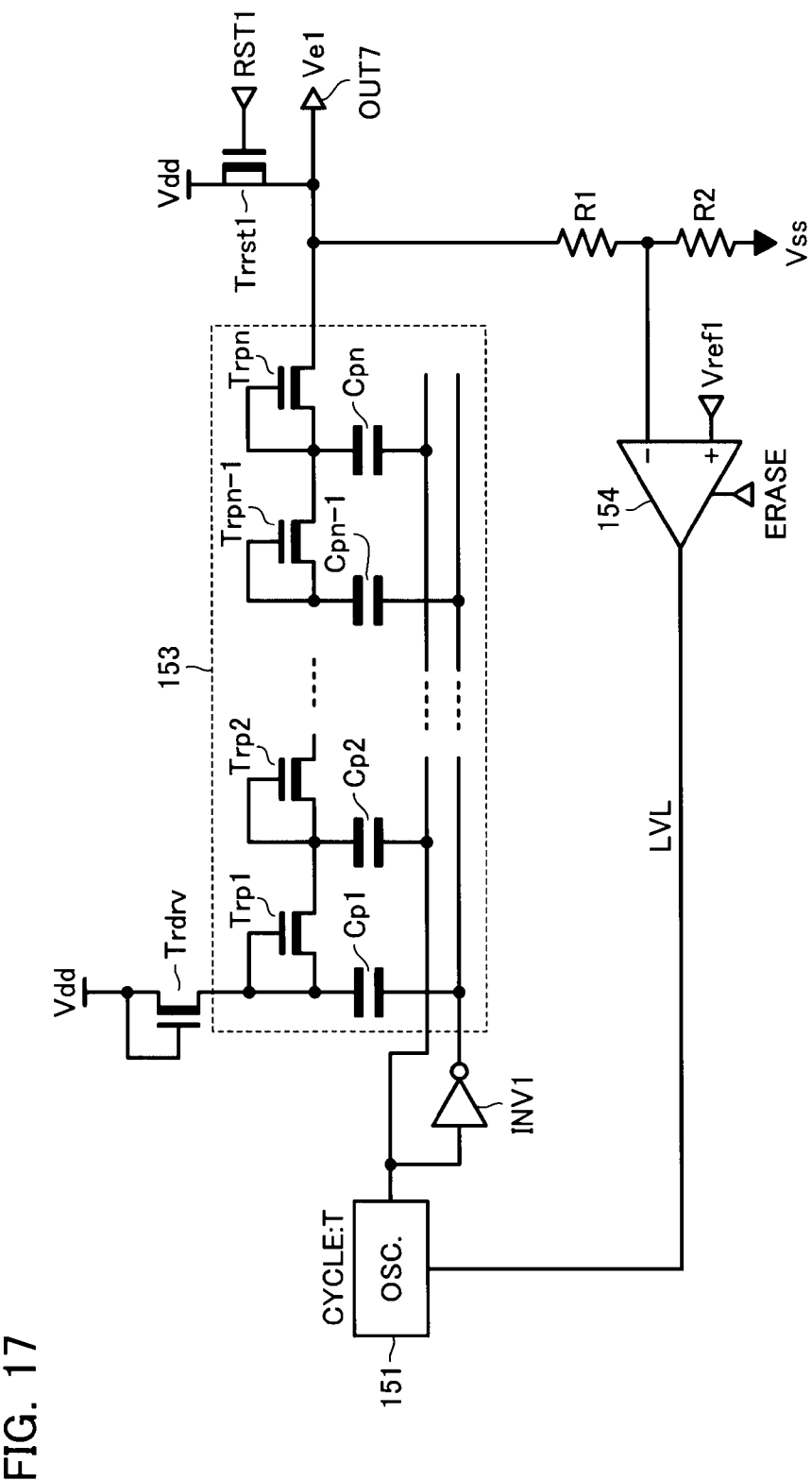
FIG. 17 is another example configuration of the booster circuit 150.
Figure 18:
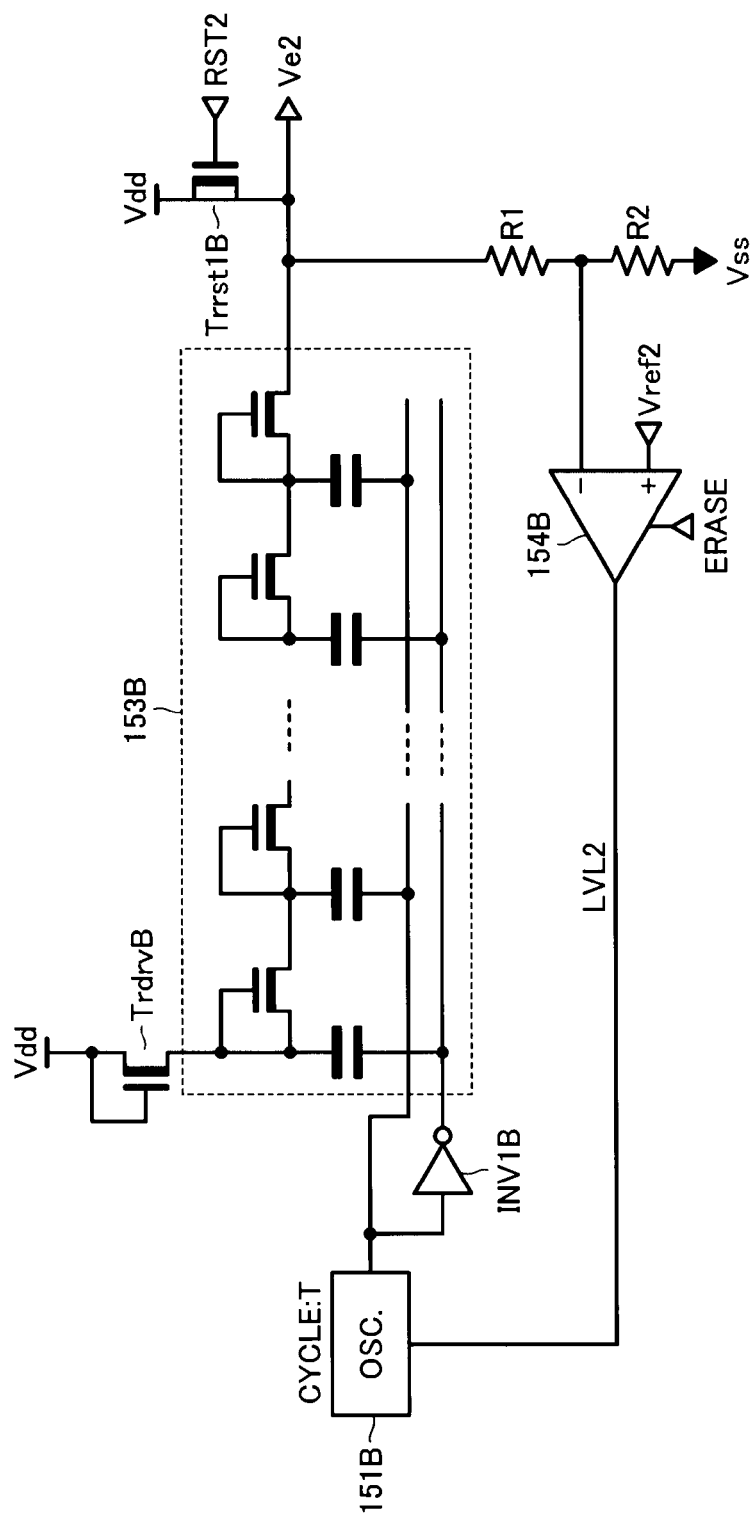
FIG. 18 is another example configuration of the booster circuit 150.
Figure 19:
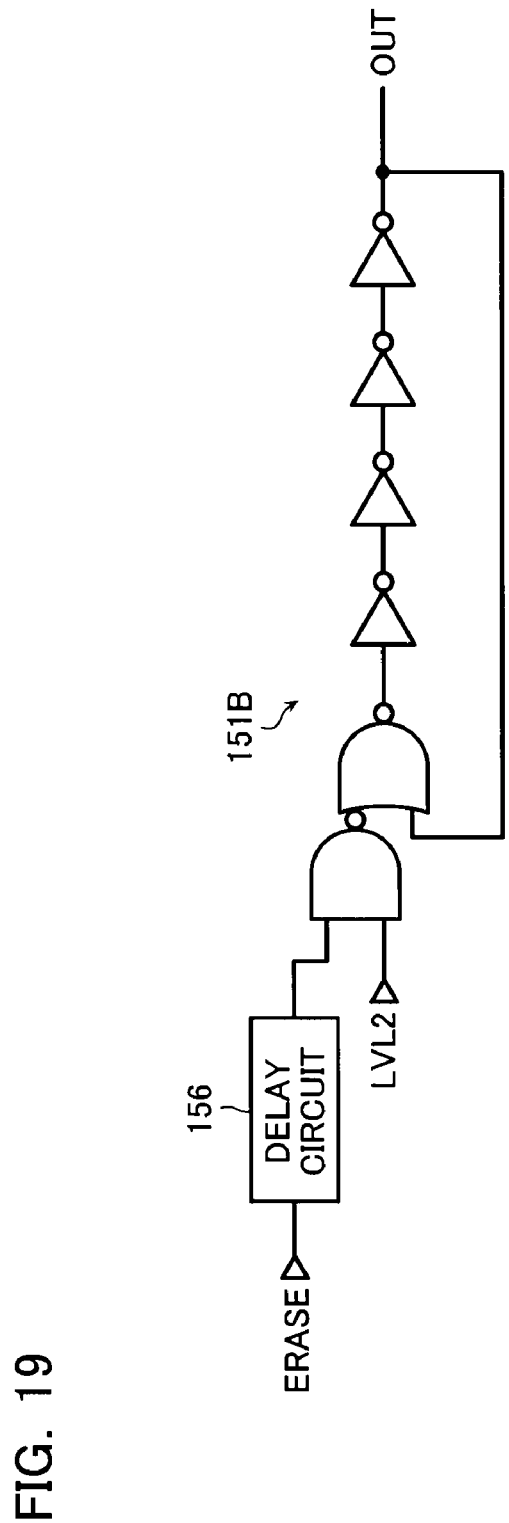
FIG. 19 is a circuit diagram of a specific example configuration of the oscillator 151B in FIG. 18.

Note that the booster circuit 150 may be separated into two booster circuits: the booster circuit shown in FIG. 17 for generating the boosted voltage Ve1; and the booster circuit shown in FIG. 18 for generating the boosted voltage Ve2. In FIG. 17, like elements as those in FIG. 16A are designated with like reference numerals. Also in FIG. 18, elements corresponding to those in FIG. 16A are designated with like reference numerals with the symbol B at their ends. The booster circuit in FIG. 18 includes an oscillator 151B as shown in FIG. 19. The oscillator 151B includes a delay circuit 156 for delaying the erase command ERASE, thereby causing the boosted voltage Ve2 to change later than the boosted voltage Ve1.

Figure 20:
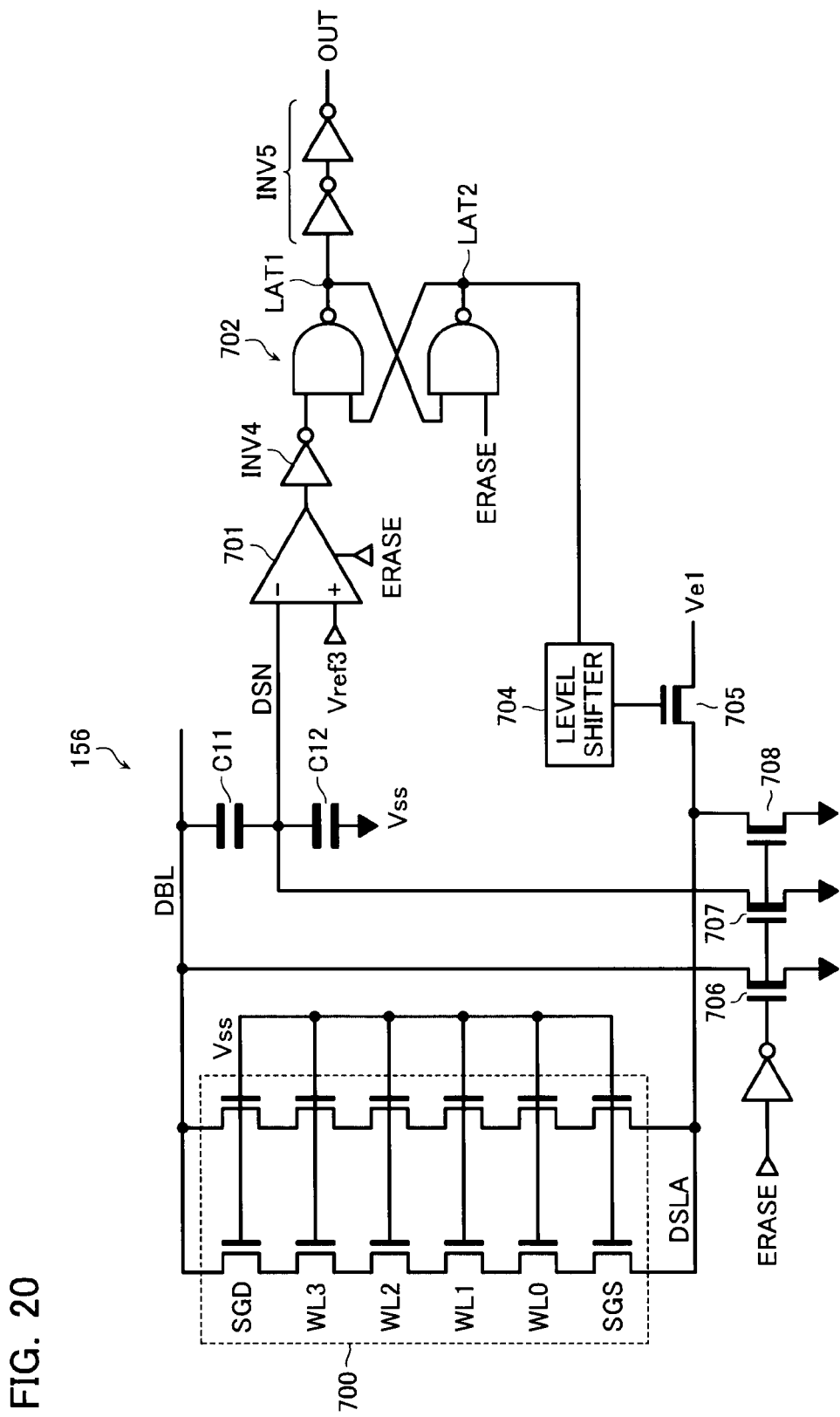
FIG. 20 is a circuit diagram of a specific example configuration of the delay circuit 156 in FIG. 19.

FIG. 20 shows an example of a specific example configuration of the delay circuit 156. The delay circuit 156 includes a dummy cell 700 that has the same structure as the NAND cell unit in the memory cell array. The dummy cell 700 includes a plurality of dummy NAND cell units between the dummy bit-line DBL and the dummy source-line DSLA. Each dummy NAND cell unit has the same structure as the normal NAND cell unit. The memory cells and the select transistors in the dummy NAND cell unit are provided with the ground voltage VSS in common at their gates.

Before the operation of the delay circuit 156, each memory cell in the dummy cell 700 generates the GIDL current like the memory cell array and is in the erase state by fixings its word-lines to the ground voltage.

Between the dummy bit-line DBL and the sense node DSN, a capacitor C11 is connected. Between the sense node DSN and the ground terminal, a capacitor C12 is connected. As a structure for detecting the potential of the sense node DSN, an operational amplifier 701 is provided. The detection output of the operational amplifier 701 is transferred to and held in a latch circuit 702 via an inverter INV4. The latch circuit 702 receives the erase command ERASE to start the operation. Data LAT1 held in the latch circuit 702 is output externally via an inverter circuit INV5.

Data LAT2 held in the latch circuit 702 is supplied to a level shifter circuit 704. The level shifter circuit 704 outputs a voltage corresponding to the held data LAT2. The transistor 705 is provided at its gate with the output voltage of the level shifter circuit 704. The drain of the transistor 705 is provided with the boosted voltage Ve1. The source of the transistor 705 is connected to the dummy source-line DSLA.

The operation of the delay circuit 156 will be described below. When the erase command ERASE rises to "H," the transistors 706 to 708 turn off, thereby switching all of the dummy bit-line DBL, the dummy source-line DSLA, and the sense line DSN from the state of being precharged to 0V to the floating state.

Then, when the voltage Ve1 rises, the voltage of the source-line DSLA increases via the transistor 705. Application of a predetermined voltage to the source-side select-gate-line in the dummy cell 700 generates the GIDL current, thereby injecting holes into the columnar semiconductor CL (channel) in the dummy cell 700. The hole injection changes the columnar semiconductor CL in the dummy cell 700 to the so-called accumulation state. This forms PN junctions in the drain-side select transistors in the dummy cell 700, thereby allowing the columnar semiconductor CL to behave as a diode that is applied with a forward voltage. The voltage of the bit-line BL thus gradually increases. The voltage increase is sensed by the operational amplifier 701. The sense result is held by the latch circuit 702 and is output externally via the inverter circuit INV5. The level shifter circuit 704 then changes the output voltage according to the change of data held by the latch circuit 702, thereby turning off the transistor 705. The change of the boosted voltage Ve2 is delayed, depending on the characteristics of the dummy cell 700, relative to the change of the boosted voltage Ve1.

[Second Embodiment]

Figure 21:
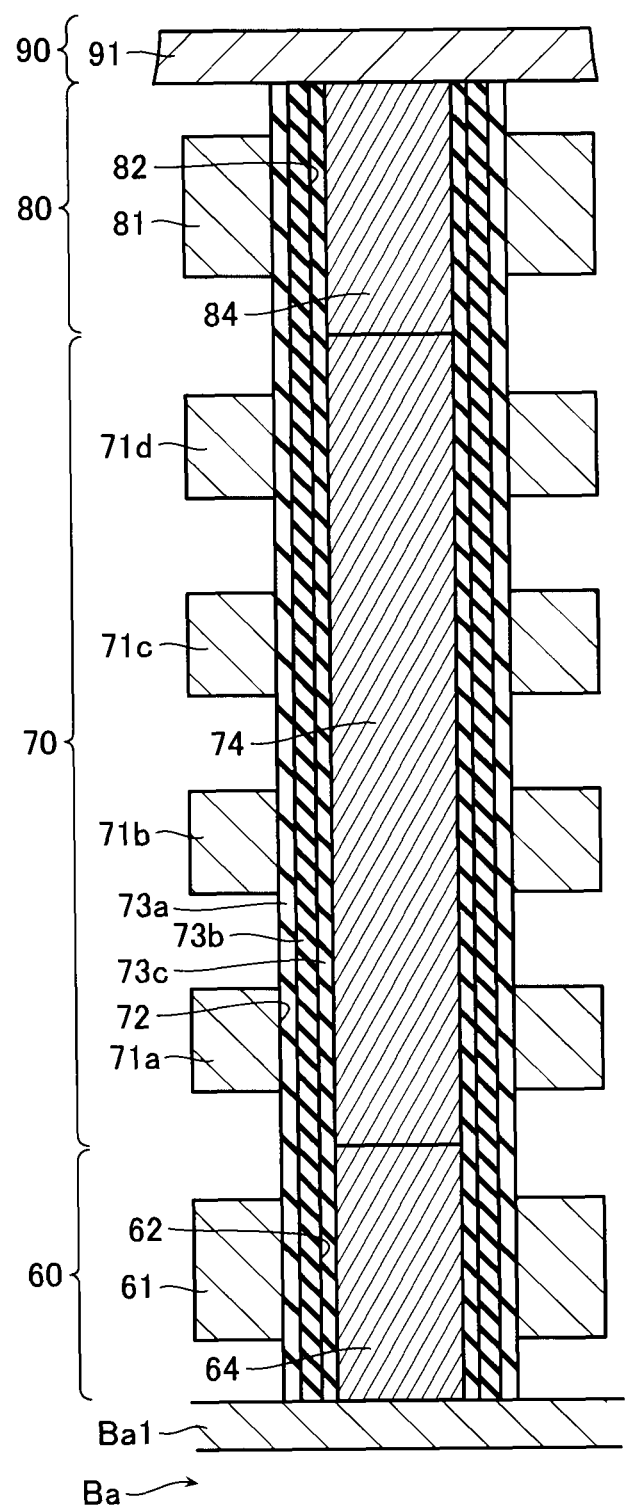
FIG. 21 is a cross-sectional view showing a configuration of a NAND cell unit of a non-volatile semiconductor memory device according to a second embodiment.
Figure 22:
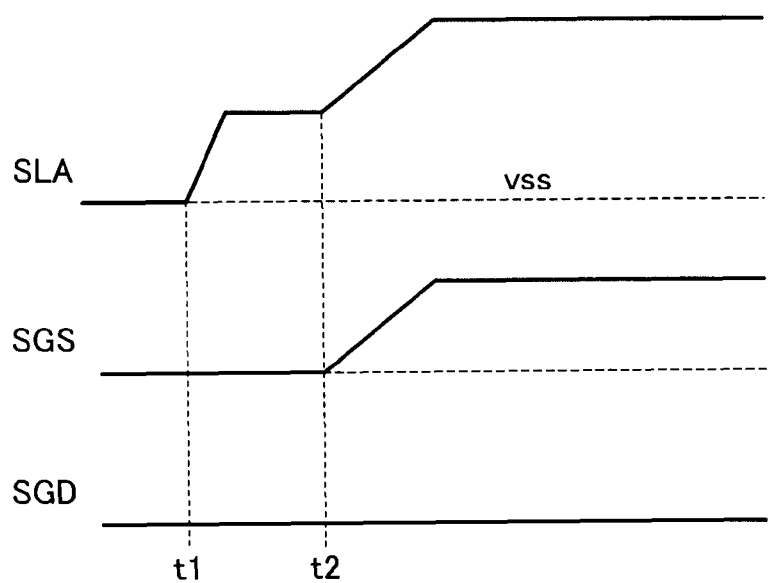
FIG. 22 shows an operation according to the second embodiment.

Referring now to FIG. 21 and FIG. 22, a schematic configuration of a non-volatile semiconductor memory device according to a second embodiment will be described. The entire configuration of the device is as shown in FIG. 1 to FIG. 3. Note, however, that, in this embodiment. as shown in FIG. 21, the drain-side select transistors SDTr and SSTr also include the block insulating layer 73a, the charge accumulation layer 73b, and the tunnel insulating layer 73c that are formed in the transistors SDTr and SSTr.

In this configuration, also in the select transistors SDTr and SSTr. Charges are accidentally held in the charge accumulation layer 73b, thereby changing the threshold voltages of the select transistors SDTr and SSTr.

Figure 23:
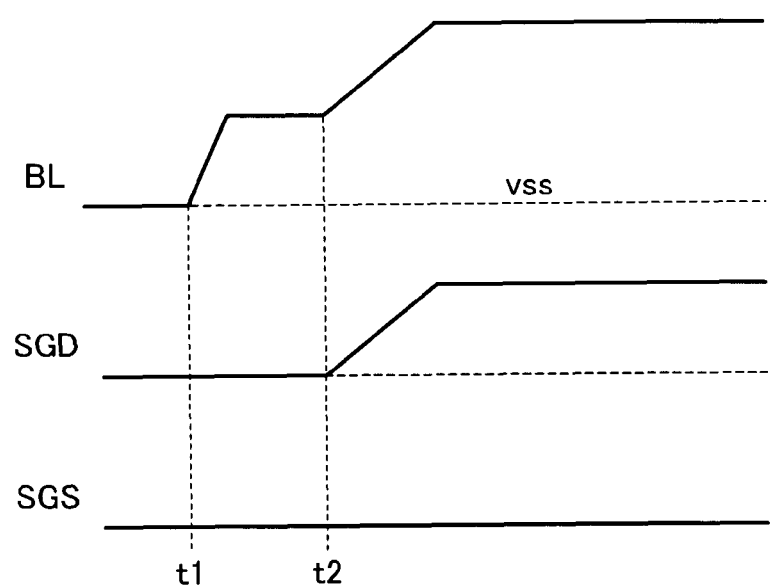
FIG. 23 shows an operation according to a third embodiment.

In this embodiment, therefore, as shown in FIG. 22 and FIG. 23, voltages are generated on the bit-line BL, the source-line SL, and the select-gate-lines SGS and SGD to generate the GIDL current to erase the select transistors SDTr and SSTr. FIG. 22 shows the voltages in the erase operation of the drain-side select transistor SSTr. FIG. 23 shows the voltages in the erase operation of the source-side select transistor SDTr.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 24:
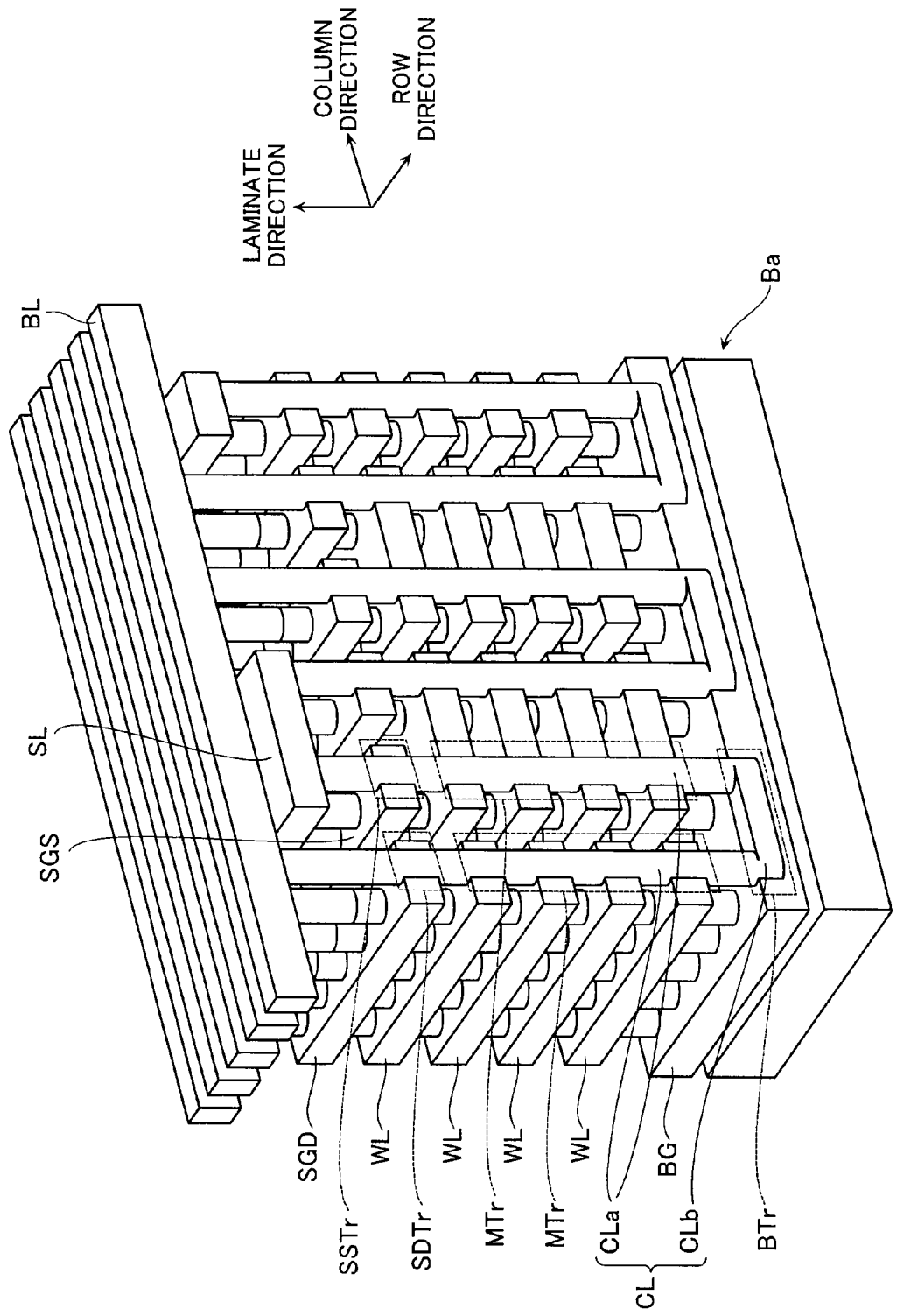
FIG. 24 is a partial schematic perspective view of a memory transistor region in a non-volatile semiconductor memory device according to other embodiment.

For example, as shown in FIG. 24, the columnar semiconductor CL may be formed in a U shape as viewed from the row direction. That is, the columnar semiconductor CL includes a pair of columnar portions CLa extending in the stacking direction and a joining portion CLb configured to join lower ends of that pair of columnar portions CLa. The joining portion CLb is surrounded by a back-gate line BG. The joining portion CLb and the back-gate line BG compose a back-gate transistor BTr.

What is claimed is:

1. A non-volatile semiconductor memory device comprising:
   a memory cell array comprising an array of NAND cell units each comprising a memory string comprising a plurality of electrically rewritable memory cells connected in series, and a drain-side select transistor and a source-side select transistor connected to ends of the memory string, respectively; and
   a control circuit configured to apply to the memory cell array various voltages for reading, writing, and erasing data,
   the NAND cell unit comprising:
   a first columnar semiconductor layer formed extending in a direction perpendicular to a substrate and functioning as bodies of the memory cells;
   a plurality of first conductive layers formed around the first columnar semiconductor layer with a charge accumulation layer for accumulating charges and a gate-insulating film sandwiched therebetween, the first conductive layers being formed over a plurality of layers, and each of the first conductive layers functioning as a word-line for selecting the memory cell;
   a second columnar semiconductor layer formed in contact with a first end portion of the first columnar semiconductor layer and formed extending in a direction perpendicular to the substrate, the second columnar semiconductor layer functioning as a body of the drain-side select transistor;
   a second conductive layer formed around the second columnar semiconductor layer with a gate-insulating film sandwiched therebetween, the second conductive layer functioning as a select-gate-line of the drain-side select transistor,
   a third columnar semiconductor layer formed in contact with a second end portion of the first columnar semiconductor layer and formed extending in a direction perpendicular to the substrate, the third columnar semiconductor layer functioning as a body of the source-side select transistor; and
   a third conductive layer formed around the third columnar semiconductor layer with a gate-insulating film sandwiched therebetween, the third conductive layer functioning as a select-gate-line of the source-side select transistor,
   a bit-line being connected to one end of the second columnar semiconductor layer,
   a source-line being connected to one end of the third columnar semiconductor layer, and
   the NAND cell units sharing the same first conductive layer and forming a block as a unit of an erase operation of the memory cell,
   the control circuit being configured to erase a selected block in the erase operation by applying a predetermined potential to the source-line and the third conductive layer to generate a current to increase a potential of the first columnar semiconductor layer and by providing a first voltage to the first conductive layer,
   and the control circuit being configured to keep the first conductive layers at a floating state for a first period, and during a second period after the first period, to switch the first conductive layers from the floating state to a state in which the first conductive layer is charged to a second voltage higher than the first voltage, in an unselected block in the erase operation.

2. The non-volatile semiconductor memory device according to claim 1, wherein
   the control circuit comprises a row decoder configured to supply a predetermined voltage to the first conductive layer according to a block address signal for addressing a block, and
   the row decoder comprises:
   a first transistor configured to be rendered conductive at a first timing to supply a voltage to the first conductive layer for reading, writing, or erasing the memory cell when a block is selected, and rendered non-conductive when a block is unselected; and a second transistor configured to be rendered conductive at a second timing later than the first timing to supply the second voltage to the first conductive layer when a block is unselected, and rendered non-conductive when a block is selected.

3. The non-volatile semiconductor memory device according to claim 2, wherein the control circuit comprises a level shifter configured to generate, according to the block address signal, a first gate signal for rendering the first transistor conductive, and a second gate signal for rendering the second transistor conductive, the first gate signal changes its logic at the first timing when the block is selected, and the second gate signal changes its logic at the second timing when the block is unselected.

4. The non-volatile semiconductor memory device according to claim 3, wherein the second gate signal has a negative voltage level.

5. The non-volatile semiconductor memory device according to claim 1, further comprising:

a source-line driver circuit configured to generate, in the erase operation, a voltage applied to the source-line according to the first voltage; and a source select-gate-line driver circuit configured to generate, in the erase operation, a voltage applied to the select-gate-line of the source-side select transistor according to the second voltage rising later than the first voltage.

6. The non-volatile semiconductor memory device according to claim 1, wherein the second conductive layer is formed around the second columnar semiconductor layer with a charge accumulation layer sandwiched therebetween, and the control circuit is configured to perform the erase operation of the drain-side select transistor.

7. The non-volatile semiconductor memory device according to claim 1, wherein the third conductive layer is formed around the third columnar semiconductor layer with a charge accumulation layer sandwiched therebetween, and the control circuit is configured to perform the erase operation of the source-side select transistor.

8. The non-volatile semiconductor memory device according to claim 2, wherein the first transistor and the second transistor are configured as a enhancement type.

9. The non-volatile semiconductor memory device according to claim 2, wherein the first transistor and the second transistor each include a back gate provided with a negative voltage.

10. The non-volatile semiconductor memory device according to claim 3, wherein the first gate signal has a voltage level higher than a power supply voltage.

11. A semiconductor device comprising a control circuit applying to a memory cell array various voltages for reading, writing, and erasing data, the memory cell array comprising an array of NAND cell units each comprising a memory string comprising a plurality of electrically rewritable memory cells connected in series, and a drain-side select transistor and a source-side select transistor connected to ends of the memory string, respectively, the NAND cell unit comprising:

a first columnar semiconductor layer formed extending in a direction perpendicular to a substrate and functioning as a bodies of the memory cells;

a plurality of first conductive layers formed around the first columnar semiconductor layer with a charge accumulation layer for accumulating charges and a gate-insulating film sandwiched therebetween, the first conductive layers being formed over a plurality of layers, and each of the first conductive layers functioning as a word-line for selecting the memory cell;

a second columnar semiconductor layer formed in contact with a first end portion of the first columnar semiconductor layer and formed extending in a direction perpendicular to the substrate, the second columnar semiconductor layer functioning as a body of the drain-side select transistor;

a second conductive layer formed around the second columnar semiconductor layer with a gate-insulating film sandwiched therebetween, the second conductive layer functioning as a select-gate-line of the drain-side select transistor, a third columnar semiconductor layer formed in contact with a second end portion of the first columnar semiconductor layer and formed extending in a direction perpendicular to the substrate, the third columnar semiconductor layer functioning as a body of the source-side select transistor; and a third conductive layer formed around the third columnar semiconductor layer with a gate-insulating film sandwiched therebetween, the third conductive layer functioning as a select-gate-line of the source-side select transistor, a bit-line being connected to one end of the second columnar semiconductor layer, a source-line being connected to one end of the third columnar semiconductor layer, and the NAND cell units sharing the same first conductive layer and forming a block as a unit of an erase operation of the memory cell, the control circuit being configured to erase a selected block in the erase operation by applying a predetermined potential to the source-line and the third conductive layer to generate a current to increase a potential of the first columnar semiconductor layer and by providing a first voltage to the first conductive layer, and the control circuit being configured to keep the first conductive layers at a floating state for a first period, and during a second period after the first period, to switch the first conductive layers from the floating state to a state in which the first conductive layer is charged to a second voltage higher than the first voltage, in an unselected block in the erase operation.

12. The semiconductor device according to claim 11, wherein the control circuit comprises a row decoder configured to supply a predetermined voltage to the first conductive layer according to a block address signal for addressing a block, and the row decoder comprises:

a first transistor configured to be rendered conductive at a first timing to supply a voltage to the first conductive layer for reading, writing, or erasing the memory cell when a block is selected, and rendered non-conductive when a block is unselected; and a second transistor configured to be rendered conductive at a second timing later than the first timing to supply the second voltage to the first conductive layer when a block is unselected, and rendered non-conductive when a block is selected.

13. The semiconductor device according to claim 12, wherein
the control circuit comprises a level shifter configured to generate, according to the block address signal, a first gate signal for rendering the first transistor conductive, and a second gate signal for rendering the second transistor conductive,
the first gate signal changes its logic at the first timing when the block is selected, and
the second gate signal changes its logic at the second timing when the block is unselected.

14. The semiconductor device according to claim 13, wherein the second gate signal has a negative voltage level.

15. The semiconductor device according to claim 11, further comprising:
a source-line driver circuit configured to generate, in the erase operation, a voltage applied to the source-line according to the first voltage; and
a source select-gate-line driver circuit configured to generate, in the erase operation, a voltage applied to the select-gate-line of the source-side select transistor according to the second voltage rising later than the first voltage.

16. The semiconductor device according to claim 11, wherein
the second conductive layer is formed around the second columnar semiconductor layer with a charge accumulation layer sandwiched therebetween, and
the control circuit is configured to perform the erase operation of the drain-side select transistor.

17. The semiconductor device according to claim 11, wherein
the third conductive layer is formed around the third columnar semiconductor layer with a charge accumulation layer sandwiched therebetween, and
the control circuit is configured to perform the erase operation of the source-side select transistor.

18. The semiconductor device according to claim 12, wherein
the first transistor and the second transistor are configured as a enhancement type.

19. The semiconductor device according to claim 12, wherein
the first transistor and the second transistor each include a back gate provided with a negative voltage.

20. The semiconductor device according to claim 13, wherein
the first gate signal has a voltage level higher than a power supply voltage.

* * * * *